(12) United States Patent
Chosa et al.

(10) Patent No.: US 6,219,074 B1
(45) Date of Patent: Apr. 17, 2001

(54) LIGHT-EMITTING DEVICE AND RECORDING DEVICE USING THE SAME

(75) Inventors: Yoshihiko Chosa; Kazuya Yamaguchi, both of Kagoshima (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/036,887

(22) Filed: Mar. 6, 1998

(30) Foreign Application Priority Data

Mar. 6, 1997 (JP) .................................................. 9-051673
Jan. 26, 1998 (JP) .................................................. 10-012475

(51) Int. Cl.[7] .................................................. G01D 15/06
(52) U.S. Cl. .............................. 347/130; 257/98; 257/100
(58) Field of Search .................... 347/130; 399/220, 399/221; 257/79, 88, 91, 93, 98, 99, 100

(56) References Cited

U.S. PATENT DOCUMENTS

| 4,455,562 | * | 6/1984 | Dolan et al. | 347/130 |
|---|---|---|---|---|
| 4,651,176 | * | 3/1987 | Yamakawa et al. | 347/130 |
| 4,734,734 | * | 3/1988 | Yano | 399/186 |
| 4,821,051 | * | 4/1989 | Hediger | 347/130 |
| 5,177,593 | * | 1/1993 | Abe | 257/98 |
| 5,179,396 | * | 1/1993 | Jeong . | |
| 5,298,768 | * | 3/1994 | Okazaki et al. | 257/81 |
| 5,444,520 | * | 8/1995 | Murano | 399/221 |
| 5,655,189 | * | 8/1997 | Murano | 399/220 |

* cited by examiner

Primary Examiner—Robert Beatty
(74) Attorney, Agent, or Firm—Ratner & Prestia

(57) ABSTRACT

A light-emitting device includes: a first plate provided a conductor pattern thereon; a second plate, a plurality of light-emitting elements disposed at predetermined portions on the first plate, respectively; a plurality of light-passing structures provided so as to respectively correspond to the plurality of light-emitting elements, wherein the light-emitting elements are sealed with a transparent resin sealant.

45 Claims, 15 Drawing Sheets

LIGHT-EMITTING DEVICE AND RECORDING DEVICE USING THE SAME

BACKGROUND OF THE INVENTION

1. Field of the Invention

The present invention relates to a light-emitting device. In particular, the present invention relates to a light-emitting device suitable for an image-writing device to be used in an optical printer such as an optical exposure type printer employing a self-developing type instant film as a recording paper. The present invention further relates to a recording device using the above-mentioned device.

2. Description of the Related Art

In recent years, along with the spread of electronic still cameras, digital video cameras, and the like, demand for a printer or a video printer, which requires no chemical treatment for development or the like and is capable of instantaneously outputting a color photography print based on a digital signal obtained from the above-described devices, has been rapidly increasing in the market targeted for personal use.

In such a video printer, there are presently two writing methods for printing paper, i.e., a sublimation type heat-transfer method and an optical exposure method. Although the sublimation type heat-transfer method is presently employed more often, a printer employing this type of writing method has disadvantages. For example, there is a limitation to the miniaturization of the printer set due to the need for an ink ribbon. In addition, running cost per recording paper is high when the cost of the ink ribbon is taken into consideration. Moreover, in the printer employing the sublimation type heat-transfer method, an image writing unit thereof has a line-shaped writing structure, the entire cost of the printer also becomes high.

On the other hand, in the optical exposure method, a recording paper is photosensitized by light irradiation to be developed. Since self-developing type recording paper is used in this method, no ink ribbon is required, realizing miniaturization of the printer set. However, most-frequently used recording paper at present is a silver-salt type instant film, resulting in high running cost per recording paper as in the sublimation type printer. Additionally, upon producing the recording paper, chemical treatment using silver salt or the like is required.

In recent years, a recording paper which is photosensitized with the respective wavelengths of the three primary colors, i.e., red (hereinafter, simply referred to as "R"), green (hereinafter, simply referred to as "G"), and blue (hereinafter, simply referred to as "B") has been developed, and has attracted great attention. Specifically, on such a recording paper, there exist photosensitive micro-capsules each having a property to react to one of the light wavelengths of R, G, and B. The recording paper is developed by exposing the micro-capsules to light. In this method, the cost per recording paper is reduced to about ⅓ of that in the silver-salt method.

With respect to light-emitting diodes (hereinafter, referred to as an "LEDs"), LEDs which emit light in the blue wavelength region or in the green wavelength region ranging from blue to green at a high luminance have been developed recently, and thus, the three primary colors of R, G, and B can be obtained at a high luminance. The LEDs attracts greatest attention as an exposure beam source for exposing the above-described micro-capsules, and are expected to be widely used in future.

In the developing method where the micro-capsules are exposed to light, an LED head is used in a printing head unit as a light-emitting device used for an image writing device, and specifically, an LED lens optical exposure method is presently suggested as the structure thereof.

Hereinafter, the conventional image writing LED head will be described with reference to FIG. 27. FIG. 27 is an enlarged cross-sectional side view illustrating a main portion of a printing head unit employing such a conventional LED head.

The printing head unit basically includes: a printed circuit board 1; LED elements 4 (only one element is shown for simplicity); a plate 2 having an aperture 9; and a spherical lens 8. In accordance with printing information supplied from a controlling unit (not shown), each of the LED elements 4 arranged as a set respectively corresponding to the three primary colors of R, G, and B emits light, and the light energy condensed by the spherical lens 8 is sequentially irradiated onto a recording paper 3 in the form of a flying spot. In this manner, the recording paper 3 is photosensitized.

Next, the above structure and its operation will be described in more detail.

One electrode in each of the LED elements 4 arranged as the set of R, G, and B is attached to a predetermined conductor pattern (not shown) on the printed circuit board 1 with conductive adhesive. The other electrodes of the respective LED elements 4 are connected to the different conductor patterns on the printed circuit board 1 with metal thin wires 5, respectively. Moreover, the aperture 9 and the spherical lens 8 are disposed directly above the LED elements 4.

The operation of the thus structured LED head is as follows.

First, a digital image is divided into image data each corresponding to one pixel (hereinafter, referred to as the pixel image data), and the pixel image data is converted into a color map. Then, the color map is converted into digital signals each of which is assigned for each pixel. The LED elements 4 emit light in accordance with the transmitted digital signals so as to be focused upon a pixel on the recording paper 3 via the aperture 9 and the spherical lens 8 located directly above each of the LED elements 4. Radiation power on the recording paper 3 causes the micro-capsules thereon to be exposed and photosensitized. The writing of an image is performed for all of the pixels on the recording paper 3 by sequentially exposing and photosensitizing the recording paper 3 in the above manner.

However, the conventional device as described above still suffers from disadvantages.

In the market, there is a demand for a reduction in printing time (i.e., time required for recording and exposing) and a light-weight miniaturized printer set as improvement in the functions of a printer. In order to achieve a reduction in printing time, in particular, there exists a need for improving an utilization efficiency of the entire radiant flux from the LED elements and thus increasing radiation power on the recording paper.

In this regard, in the above-described conventional LED head, only a part of radiant flux passed through an opening of the spherical lens 8 via the aperture 9 is condensed among the entire radiant flux emitted from the LED elements 4. Thus, as compared to the entire radiant flux emitted from the LED elements 4, actual radiation power on the recording paper 3 is low.

In order to increase the radiation power on the recording paper 3, it is most effective to enlarge the opening of the spherical lens 8, i.e., to increase a diameter of the lens 8. However, the increased lens diameter results in a longer optical path length and disadvantages associated with an aberration, thereby preventing an uniform and sharp light beam from forming.

Thus, in the conventional LED head, it is difficult to improve the utilization efficiency of light above the level currently obtainable. As a result, it is difficult to increase radiation power on the recording paper, and thus the printing time cannot be shortened.

Moreover, in the conventional optical system, the optical path length from the LED elements 4 to the recording paper 3 is long, and therefore, its miniaturization is hard to be realized. In addition, high assembling accuracy and large number of steps are required for adjusting the focusing condition, focus control is hard to be performed.

Furthermore, there are many problems including those described hereinafter. For example, since a beam diameter varies due to color aberration resulting from differences among wavelengths, the resolution is thereby adversely affected. In addition, since a beam diameter cannot be made smaller than the luminescent size of the LED elements, resolution smaller than the luminescent size of the LED elements is hard to be realized.

Moreover, some LED elements are susceptible to static electricity due to the physical constant (e.g., dielectric constant c) of a constituent material or a structure of the LED element.

SUMMARY OF THE INVENTION

A light-emitting device of the present invention includes: a first plate provided a conductor pattern thereon; a plurality of light-emitting elements disposed at predetermined portions on the first plate, respectively; and a plurality of light-passing structures provided so as to respectively correspond to the plurality of light-emitting elements.

In one embodiment, the first plate is a printed circuit board; a second plate is further disposed in a light-emitting direction of the light-emitting elements; and the second plate is provided with a plurality of openings, each having a diameter of 1 mm or less, so as to respectively correspond to the plurality of light-emitting elements, the plurality of openings functioning as the plurality of light-passing structures.

In another embodiment, the plurality of light-passing structures are provided in the first plate so as to correspond positions at which the respective light-emitting elements are disposed.

Preferably, each of the light-emitting elements is arranged such that a center of a light-emitting surface thereof is substantially aligned with a center line of the corresponding light-passing structure.

The respective light-emitting elements may be sealed with a transparent resin sealant. In such a case, preferably, an upper surface of a seal structure formed by the transparent resin sealant is a flat surface.

Furthermore, the upper surfaces of the respective seal structures corresponding to the respective light-emitting elements may be positioned at the same level.

The transparent resin sealant may be formed into a predetermined shape by a molding process using a mold, which can be a transfer molding process.

The transparent resin sealant may be formed by selective adhesion.

In one embodiment, the light-emitting device further includes a substrate or a molded member, on the printed circuit board, in which hollows are provided at positions at which the respective light-emitting elements are to be disposed.

The respective light-emitting elements provided in the hollows of the substrate or the molded member may be sealed with a transparent resin sealant which is formed into a predetermined shape by a molding process using a mold or formed by injecting a transparent resin into the respective hollows.

In one embodiment, the respective light-emitting elements are sealed with a transparent resin sealant; and the printed circuit board and the second plate are arranged so as to face each other with the plurality of light-emitting elements interposed therebetween, a distance between the facing printed circuit board and second plate being substantially equal to a thickness of the transparent resin sealant.

The transparent resin sealant is preferably made of an epoxy resin or a silicone resin.

In one embodiment, each of the light-emitting elements includes: a transparent substrate; a P-type semiconductor region and an N-type semiconductor region provided in the transparent substrate; a P-electrode electrically connected to the P-type semiconductor region; and an N-electrode electrically connected to the N-type semiconductor region. The P-electrode and the N-electrode are formed on the same surface of the light-emitting element to be electrically connected to the conductor pattern on the first plate, respectively.

The transparent substrate may have a curved shape.

Electrical connections between the P-electrode and the conductor pattern and between the N-electrode and the conductor pattern may be established using a conductive adhesive or a micro-bump.

In one embodiment, each of the light-emitting elements includes a thin film provided at an end portion thereof including a light-emitting region but excluding the P-electrode, and the light-emitting element is arranged such that a pn-junction thereof is arranged substantially perpendicular to the first plate and is electrically connected to the conductor pattern on the first plate using a conductive adhesive.

In one embodiment, each of the light-emitting elements is electrically connected to the conductor pattern on the first plate with a thin metal wire. A connecting point between the thin metal wire and the conductor pattern functions as a primary connection of the thin metal wire, and a connecting point between the thin metal wire and the light-emitting element functions as a secondary connection of the thin metal wire.

In one embodiment, the printed circuit board is provided with steps at positions at which the respective light-emitting elements are disposed. Each of the steps has a size in accordance with a height of the corresponding light-emitting element.

In one embodiment, the printed circuit board is provided with at least one concave portion, and at least one of the light-emitting elements is provided therein.

In one embodiment, the second plate is made of metal or resin, and the plurality of openings are formed by a chemical etching process.

In one embodiment, the second plate is made of metal or resin, and the plurality of openings are sealed with a glass or a transparent resin.

In one embodiment, the second plate is made of metal or resin; and a third plate or sheet made of a glass or a transparent resin is further provided in a light-emitting direction of the light-emitting elements with respect to the second plate.

In one embodiment, the first plate is a printed circuit board; a second plate made of a glass or a transparent resin is further disposed in a light-emitting direction of the light-emitting elements; and the second plate is provided with a plurality of predetermined regions, each having a diameter of 1 mm or less, so as to function as the plurality of light-passing structures.

In-one embodiment, the first plate is a printed circuit board; a second plate made of a glass or a transparent resin is further disposed in a light-emitting direction of the light-emitting elements; and the second plate is provided with a plurality of predetermined regions, each having a diameter of 1 mm or less and being constituted using optical fibers, so as to function as the plurality of light-passing structures.

In one embodiment, the first plate is a printed circuit board; a second plate constituted using optical fibers is further disposed in a light-emitting direction of the light-emitting elements; and the second plate is provided with a plurality of predetermined regions, each having a diameter of 1 mm or less, so as to function as the plurality of light-passing structures.

In one embodiment, an antireflection coating layer is provided on a surface of the second plate which opposes the light-emitting elements.

Each of the light-emitting elements may be a light-emitting diode element.

Specifically, the light-emitting diode element may emit light having a wavelength in one of a red color region, a green color region, or a blue color region.

The light-emitting diode element emitting light having a wavelength in the red color region may have an electrode on an upper surface thereof with a position offset from a center of the upper surface.

At least one of a bottom surface and side surfaces of the light-emitting diode element may be subjected to a light-blocking treatment (in other words, a light-shielding treatment).

In one embodiment, each of the light-emitting elements includes: an insulative transparent substrate; and a P-type semiconductor region and an N-type semiconductor region provided in the transparent substrate. Each of the light-emitting elements is electrically connected to an electrostatic discharge (in the present application, also referred to as "ESD") protection component which has a first region and a second region electrically connected to the P-type semiconductor region and the N-type semiconductor region, respectively, so as to be configured such that a electrical current flows between the first region and the second region when a voltage equal to or less than a breakdown voltage between the P-type semiconductor region and the N-type semiconductor region is applied thereacross.

The transparent substrate may have a curved shape.

The respective light-emitting elements and the ESD protection component may be electrically connected by a micro-bump.

Two or more of the light-emitting elements may be electrically connected to a single ESD protection component.

A plurality of the ESD protection components respectively corresponding to the light-emitting elements may be provided on a single substrate.

The ESD protection component may have a reflection structure for reflecting light emitted from the light-emitting element.

The reflection structure may be a concave portion which is sealed with a resin.

The ESD protection component may have an electrode configured so as to reflect light emitted from the light-emitting element into a predetermined direction.

The ESD protection component may be a diode element.

In one embodiment, the first plate is a printed circuit board; a second plate is further disposed in a light-emitting direction of the light-emitting elements; the second plate is provided with a plurality of openings, each having a diameter of 1 mm or less, so as to respectively correspond to the plurality of light-emitting elements, the plurality of openings functioning as the plurality of light-passing structures; and the respective light-emitting elements which are electrically connected to the ESD protection component is in contact with the second plate.

At least one of the light-emitting elements may be a GaN-type compound semiconductor light-emitting element.

According to another aspect of the present invention, a recording device including a light-emitting device which in turn includes a light-emitting element is provided. The recording device performs a writing operation onto a recording paper using light emitted from the light-emitting element. It should be noted that the light-emitting device included therein can have the above-described feature(s) obtainable by the present invention.

The recording device is preferably configured such that a distance from a light-emitting surface of the light-emitting element to the recording paper is set to be 5 mm or less.

According to the present invention, instead of a lens optical system, a system in which a distance between the light-emitting section of the LED element and the recording paper is shortened is employed. This system utilizes such characteristics that radiation power on the recording paper increases as the inverse square of the distance between the light-emitting surface of the LED element and the recording paper. By reducing the above-mentioned distance, the entire radiant flux emitted from the LED element is effectively irradiated onto the recording paper.

In order to achieve this objective, the light-emitting device of this invention includes: a wiring board; a plurality of light-emitting elements (e.g., the LED elements) mounted on the wiring board; and a plate having light-passing areas at positions corresponding to the light-emitting elements which is provided in a light-emitting direction of the light-emitting elements. Alternatively, the light-emitting device of the present invention includes: a wired plate; a plurality of light-emitting elements (e.g., the LED elements) mounted on the plate; and light-passing structures provided at positions respectively corresponding to the plurality of light-emitting elements on the plate. In the light-emitting device of the present invention, the recording paper is disposed to be as close to the light-emitting element as possible.

According to the present invention, a small and light-weight light-emitting device with a high light utilization efficiency, which is capable of irradiating the recording paper at a higher radiation power and reducing the printing time, can be obtained. In addition, a recording device using such a light-emitting device is also obtained.

Thus, the invention described herein makes possible the advantages of (1) providing a small-size light-weight light-emitting device with a high light utilization efficiency which is capable of reducing printing time by irradiating a recording paper at a higher radiation power; (2) providing a recording device using such a light-emitting device; (3) realizing a small-size light-weight light-emitting device having a flip-chip structure by employing a component capable of exhibiting a function of protecting the light-emitting element from destruction caused by electrostatic discharge (abbreviated as "ESD" in this specification); and (4) providing a recording device using such a light-emitting element.

These and other advantages of the present invention will become apparent to those skilled in the art upon reading and understanding the following detailed description with reference to the accompanying figures.

DESCRIPTION OF THE PREFERRED EMBODIMENTS (Embodiment 1)

Figure 1:
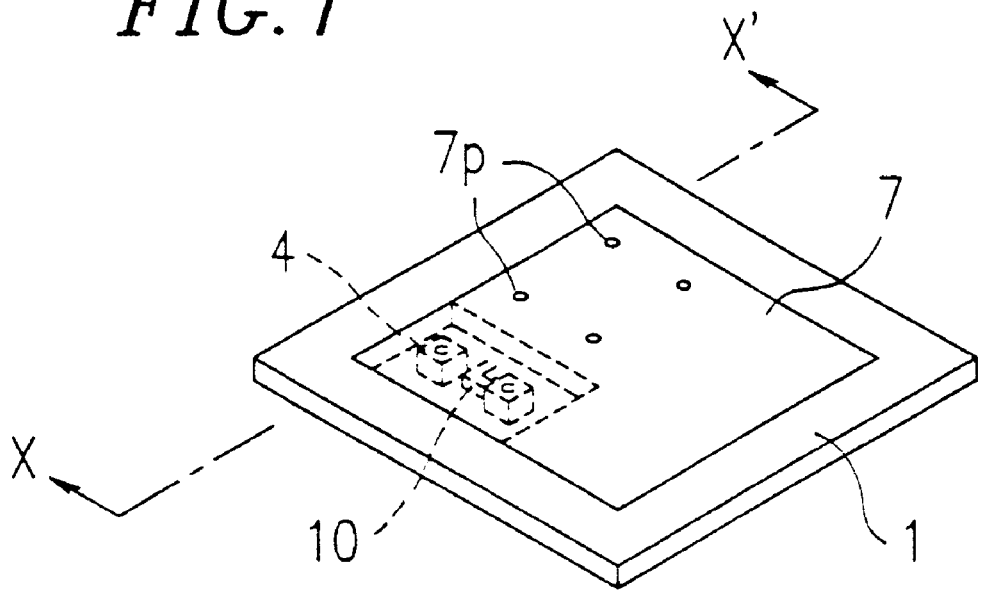
FIG. 1 is a perspective view illustrating an appearance of a light-emitting device mounted in a printing head unit according to the present invention.
Figure 2:
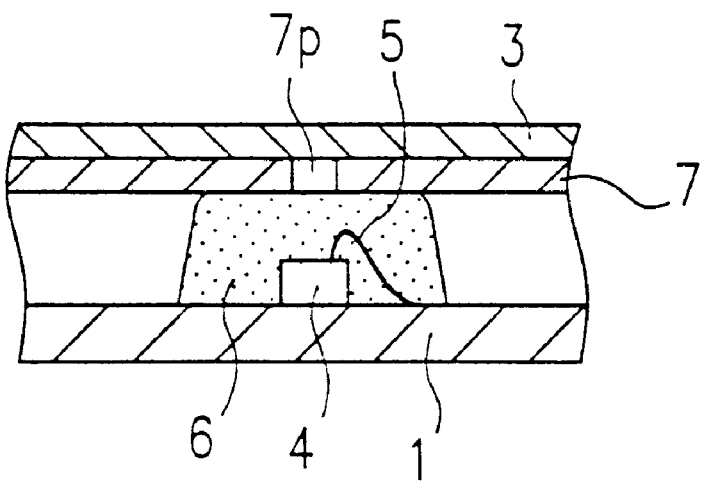
FIG. 2 is a partially omitted and enlarged cross-sectional side view of the light-emitting device taken along line X–X' in FIG. 1 according to Embodiment 1 of the present invention.

FIG. 1 is a perspective view illustrating an appearance of an LED head (which is a light-emitting device) mounted in a printing head unit according to the present invention. FIG. 2 is a partially omitted and enlarged cross-sectional side view of the LED head taken along line X–X' in FIG. 1.

It should be noted that in the following various embodiments of the present invention, the whole configuration of the LED head appears as illustrated in FIG. 1. Thus, this figure is also referred to in connection with the subsequent embodiments.

Reference numeral 1 denotes a printed circuit board; reference numeral 3 denotes a recording paper; F -reference numeral 4 denotes LED elements; reference numeral 5 denotes a metal thin wire; reference numeral 6 denotes a transparent resin sealant; reference numeral 7 denotes a plate having light-passing areas 7p; and reference numeral 10 denotes a conductor pattern. The conductor pattern 10 provided on the printed circuit board 1 is not illustrated in FIG. 2.

Each of the LED elements 4 is disposed at a predetermined position in the printed circuit board 1 as shown in FIG. 1, and attached to the printed circuit board 1 with conductive adhesive or the like. The printed circuit board 1 is wired with the conductor pattern 10 (only a portion thereof is illustrated) so that the LED elements 4 are electrically connected and allowed to emit light.

For the LED element 4 emitting red light (also referred to as the R-LED element), the R-LED element 4 is attached to the printed circuit board 1 with conductive adhesive for electrical connection. The other electrode of the R-LED element 4 is connected to the printed circuit board 1 by the conductor pattern 10 and the metal thin wire 5 for electrical connection.

For the LED elements 4 for emitting green or blue light (also referred to as the G-LED element or the B-LED element), the G-LED element and B-LED element 4 are attached to the printed circuit board 1 with adhesive, and each of two electrodes of the G-LED element and B-LED element 4 is electrically connected to the conductor pattern 10 on the printed circuit board 1 by the metal thin wire 5.

With respect to luminescent color for the respective R-, G-, and B-LED elements, the peak luminescent wavelength of the R-LED element is about 600 to about 700 nm, the peak luminescent wavelength of the G-LED element is about 500 to about 600 nm, and the peak luminescent wavelength of the B-LED element is about 400 to about 500 nm.

As shown in FIG. 2, the plate 7 having the light-passing areas 7p with an opening diameter of about 1 mm or less at positions respectively corresponding to the LED elements 4 is provided in a light-emitting direction of the LED elements 4. The center of each of the light-passing areas 7p is disposed so as to approximately correspond to the center of the counterpart LED element 4, thereby improving a light utilization efficiency.

The plate 7 is preferably formed of metal, glass, or transparent resin. For example, the plate 7 made of stainless steel is advantageous since it can be processed into a desired shape with high precision. Although the conventional optical lens condensing system requires an opening diameter of the light-passing areas to be about 3 to 4 mm, an opening diameter of the light-passing areas 7p is, for example, about 0.5 mm according to the embodiment of the present invention. For practical use, an opening diameter of about 1 mm or less is sufficient. This is because an opening diameter of the light-passing areas 7p corresponds to an optical resolution, and it becomes impossible to perform desired printing when the optical resolution exceeds about 1 mm.

The photosensitive recording paper 3 is placed on the plate 7. Of the entire light emitted from the LED elements 4, unnecessary light is blocked by the plate 7 provided in the light-emitting direction of the LED elements 4. Thus, only light passed through the light-passing areas 7p photosensitizes the recording paper 3.

The printed circuit board 1 is typically made of aluminum for meeting the required heat conducting property and flatness. The thickness t of the printed circuit board 1 is set, for example, to be t=1 mm.

Moreover, according to the present embodiment, the LED elements 4, a part of the conductor pattern 10 and the metal thin wire 5 are sealed with a transparent resin sealant 6 on the main surface of the printed circuit board 1, for example, by transfer molding, in order to protect the LED elements 4 and improve a light utilization efficiency. The upper surfaces of the sealed structures where the transparent resin sealants 6 for the respective LED elements 4 contact with the plate 7 are positioned at the same level so as to form a flat surface. As the transparent resin sealant 6, epoxy resin for transfer molding can be used. Since this transfer molding enables more accurate thin shape molding, a distance between the LED elements 4 and the recording paper 3 can be shortened to a level, for example, about half of the typical distance in the conventional structure.

As a molding method, the following method is employed. In order to improve productivity, a group structure in which a plurality of printed circuit boards are joined is formed. A plurality of such groups (each including a plurality of printed circuit boards) are disposed on the same metal mold, and simultaneously molded by performing a pressing process and a resin injection process each once. A runner structure of the transfer metal mold for the resin injection has a configuration in which a runner branches off from a resin injection inlet of the transfer metal mold and a plunger toward each group of the printed circuit boards. The runner further branches off toward each of cavities which are provided such that one cavity is independently provided for each LED element.

Although the transfer molding is described as the molding method, other molding methods can be employed. For example, casting in which sealant is formed by injecting resin into a mold or the like may be employed.

The metal thin wire 5 is preferably provided so as not to reach a high level between the printed circuit board 1 and the plate 7, so that the sealant 6 can be formed with a low profile.

As described above, according to the present embodiment, by providing the plate 7 having the light-passing areas 7p with an opening diameter of about 1 mm or less at positions respectively corresponding to a plurality of the LED elements 4 attached to predetermined positions in the printed circuit board 1, an excellent resolution and a high utilization efficiency of light from the LED elements 4 are obtained, and the recording paper 3 can be irradiated at a higher radiation power. Moreover, since the LED elements 4 and the associated components are covered with the thin transparent resin sealants 6 which are formed to have flat upper surfaces at the same level, the plate 7 can be provided in a stable manner on the transparent resin sealants 6, allowing the light-emitting surface of the LED elements 4 to be disposed in proximity to the recording paper 3. As a result, radiant flux of light passed through the light-passing areas 7p is increased, and thus radiation power on the recording paper 3 can be raised. This in turn realizes a reduced exposure time required for writing onto the recording paper 3, resulting in an enhanced writing speed being achieved.

(Embodiment 2)

Figure 3:
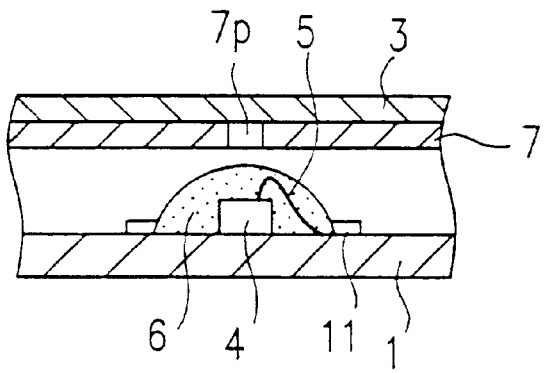
FIG. 3 is a partially omitted and enlarged cross-sectional side view of a light-emitting device taken along line X–X' in FIG. 1 according to Embodiment 2 of the present invention.

FIG. 3 is a partially omitted and enlarged cross-sectional side view of an LED head as a light-emitting device according to Embodiment 2 of the present invention, which corresponds to the illustration taken along line X–X' in FIG. 1.

Reference numeral 1 denotes a printed circuit board. Reference numeral 4 represents an LED element (only one element is illustrated for simplicity), which is accompanied with a metal thin wire 5 and a transparent resin sealant 6 as in Embodiment 1. Reference numeral 7 denotes a plate having light-passing areas 7p (only one area is illustrated for simplicity). The constituent material of the plate 7 and the opening diameter of the light-passing area 7p are the same as those in Embodiment 1. Reference numeral 3 denotes a recording paper. Reference numeral 11 denotes a resist layer described later. The conductor pattern 10 provided on the printed circuit board 1 is not illustrated in FIG. 3. Like components in the present embodiment are designated by like reference numerals as in the previous embodiment. Thus, the detailed descriptions thereof may be omitted herein.

Each of the LED elements 4 is placed at a predetermined position in the printed circuit board 1 as shown in FIG. 1. The LED element 4 is attached to the printed circuit board 1 in the same manner as in Embodiment 1 for electrical connection. Moreover, the peak luminescent wavelength of the R-LED element is about 600 to about 700 nm, the peak luminescent wavelength of the G-LED element is about 500 to about 600 nm, and the peak luminescent wavelength of the B-LED element is about 400 to about 500 nm.

The LED element 4, a portion of the conductor pattern 10, and the metal thin wire 5 are sealed and protected by the transparent resin sealant 6 on the main surface of the printed circuit board 1. The transparent resin sealant 6 is formed as follows. A transparent resin material is selectively adhered to the LED element 4 and the conductor pattern 10 to which the LED element 4 is connected by the metal thin wire 5 on the main surface of the printed circuit board 1. Then, the transparent resin material is cured while viscous flow thereof is prevented. Accordingly, a typical shape of the transparent resin sealant 6 is approximately semi-spherical.

Methods for selectively adhering the transparent resin material include a dropping method using a dispenser, a printing method using a roller, and a screen printing method.

A portion of the conductor pattern 10 is utilized for preventing the transparent resin sealant 6 from outflowing from the predetermined adherence position. For the above purpose, a part of conductor pattern which is originally provided for wiring may be used. Alternatively, a different pattern dedicated solely for the above purpose of preventing the outflowing of the resin sealant 6 may be formed simultaneously with the formation of the conductor pattern for wiring.

Furthermore, a layered structure can be formed by providing the resist layer 11 on the conductor pattern as shown in FIG. 3. This more effectively prevents the outflowing of the resin sealant 6. Preferably, the color of the resist layer 11 is, for example, white having an excellent light reflecting function in order to allow the light to emit at a high efficiency from the LED element 4. It is also possible to provide the structure for preventing the outflow of the resin sealant 6 only with the resist layer 11.

Instead of the selective adhering method as described above, the transparent resin material may be adhered to the entire surface of the LED element 4. For that purpose, a dipping method, for example, can be employed in which resin is adhered on the surface of the LED element 4 by dipping the printed circuit board 1 (with the LED element 4 electrically connected thereto by the metal thin wire 5) into liquid resin. Alternatively, a spraying method in which resin is sprayed onto the A surface of the LED element 4 using a sprayer or the like can be employed.

When the plate 7 closely contacts the transparent resin sealant 6 so that a distance between the plate 7 and the printed circuit board 1 equals a thickness of the transparent resin sealant 6, light emitted from the LED element 4 can pass through the light-passing area 7p without passing through the air. As a result, radiant flux of light passed through the light-passing area 7p is increased.

In order to allow the light to effectively emit from the LED element 4, the refractive index of the transparent resin sealant 6 is preferably close to the refractive index of the LED element 4 (for example 3.5) in accordance with Snell's law. In addition, in order to improve an utilization efficiency of light emitted from the LED element 4, the transparent resin sealant 6 is preferably a resin of an optical grade having a high light transmittance, which allows light to linearly propagate therein without absorption, refraction, or irregular reflection. In particular, epoxy resin or silicone resin is preferably employed.

Epoxy resin is more preferable as compared to silicone resin. Epoxy resin has a larger refractive index than silicone resin, resulting in a higher efficiency at which the light is allowed to emit from the LED element 4 and improved light transmittance with respect to the respective wavelengths, which in turn provides a higher light utilization efficiency. Furthermore, since epoxy resin has a higher hardness when cured as compared to silicone resin, a stable shape is obtained onto which the plate 3 can be directly attached thereon in a stable manner. This realizes an improved mechanical strength of the resultant LED head.

As described above, according to the present embodiment, the transparent resin sealants 6 are applied with a small thickness to the plurality of the LED elements 4 mounted at the predetermined positions in the printed circuit board 1 by a dropping method or the like, and thus, a distance between the light-emitting surfaces of the LED elements 4 and the recording paper 3 can be shortened. As a result, radiant flux of light passed through the light-passing area 7p is increased, thereby increasing radiation power on the recording paper 3.

(Embodiment 3)

Figure 4A:
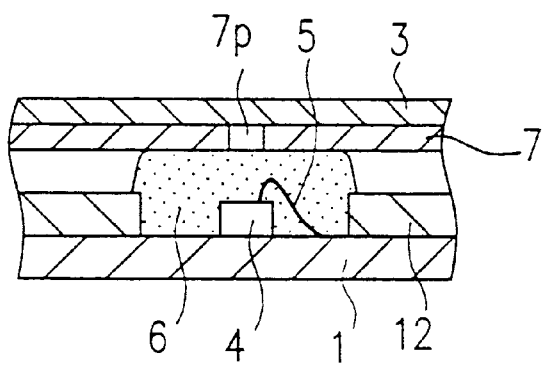
FIG. 4A is a partially omitted and enlarged cross-sectional side view of a light-emitting device taken along line X–X' in FIG. 1 according to Embodiment 3 of the present invention.
Figure 4B:
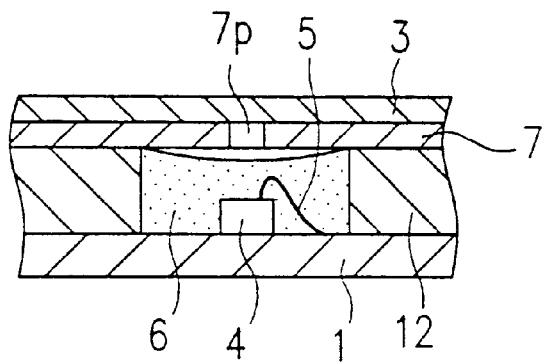
FIG. 4B is a partially omitted and enlarged cross-sectional side view illustrating the modified light-emitting device taken along line X–X' in FIG. 1 according to Embodiment 3 of the present invention.

FIGS. 4A and 4B are partially omitted and enlarged cross-sectional side views of an LED head as a light-emitting device according to Embodiment 3 of the present invention, which corresponds to the illustration taken along line X–X' in FIG. 1.

Reference numeral 1 denotes a printed circuit board. Reference numeral 4 represents an LED element (only one element is illustrated for simplicity), which is accompanied with a metal thin wire 5 and a transparent resin sealant 6 as in the previous embodiments. Reference numeral 7 denotes a plate having light-passing areas 7p (only one area is illustrated for simplicity). Reference numeral 3 denotes a recording paper. Reference numeral 12 denotes a substrate or a molded resin structure described later. The conductor pattern 10 provided on the printed circuit board 1 is not illustrated in FIGS. 4A and 4B. The constituent material of the plate 7 and the opening diameter of the light-passing areas 7p are the same as those in the previous embodiments. Like components in the present embodiment are designated by like reference numerals as in the previous embodiments. Thus, the detailed descriptions thereof may be omitted herein.

Each of the LED element 4 is placed at a predetermined position of the printed circuit board 1 as shown in FIG. 1. The LED element 4 is attached to the printed circuit board 1 in the same manner as in Embodiment 1 for electrical connection. Luminescent colors (wavelengths of the emitted light) in Embodiment 3 are the same as those described in Embodiment 1.

FIG. 4A shows the case where the LED element 4 is sealed by transfer molding. The substrate 12, having hollows each with a diameter of about 2 mm at positions where the respective LED elements 4 are placed, is provided on the printed circuit board 1 by vacuum pressure welding. The thickness of the substrate 12 is typically set to be about t=0.2 mm, and the transparent resin sealant 6 is formed of epoxy resin for transfer molding.

On the other hand, FIG. 4B shows the case where the transparent resin sealant 6 is provided by injection process. The thickness of the substrate 12 in this case is typically set to be about t=0.5 mm. The transparent resin sealant 6 is preferably a casting resin of an optical characteristics grade. Since the substrate 12 is required to have heat resisting property when sealed with resin, white is selected as the color of the substrate 12. White is also advantageous for effectively reflecting light emitted from the side faces of the LED element 4.

Moreover, in order to allow the light to effectively emit from the LED element 4, the refractive index of the transparent resin sealant 6 is preferably close to the refractive index of the LED element 4 (for example 3.5) in accordance with Snell's law. In addition, in order to improve an utilization efficiency of light emitted from the LED element 4, the transparent resin sealant 6 is preferably a resin of an optical grade having a high light transmittance, which allows light to linearly propagate therein without absorption, refraction, or irregular reflection. In particular, epoxy resin or silicone resin is preferably employed.

Instead of the substrate 12, a molded resin structure may be attached to the printed circuit board 1 by adhesion or mechanical attachment using, e.g., screws, to be used in the same manner as that described above.

When the printed circuit board 1 is made of ceramic capable of easily forming a layered structure, the above-described structure can be readily obtained.

By attaching the substrate or the molded resin structure 12 to the printed circuit board 1 as described above, a light-blocking effect (a light-shielding effect) between the adjacent LED elements 4 can be obtained. As a result, color interference between the adjacent LED elements 4 can be prevented, and printing quality is thereby improved.

As described above, according to the present embodiment, the substrate or the molded resin structure 12 having hollows at positions where the respective LED elements 4 are placed is provided on the printed circuit board 1, and the transparent resin sealant 6 is formed by a molding method using a mold or a resin injection method. As a result, a distance between the light-emitting surface of the LED elements 4 and the recording paper 3 can be shortened. Thus, radiant flux of light passed through the light-passing areas 7p is increased, and radiation power on the recording paper 3 increases.

(Embodiment 4)

Figure 5A:
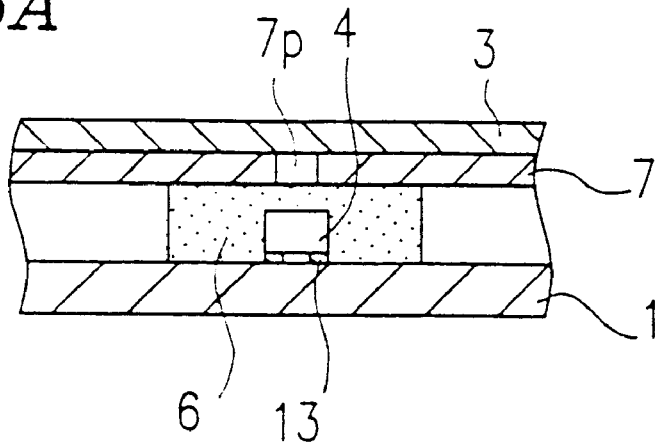
FIG. 5A is a partially omitted and enlarged cross-sectional side view of a light-emitting device taken along line X–X' in FIG. 1 according to Embodiment 4 of the present invention.
Figure 5B:
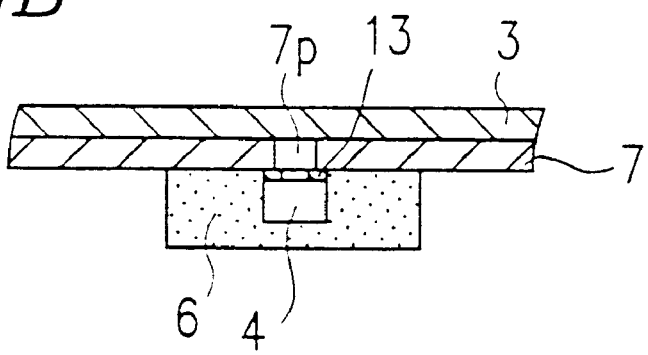
FIG. 5B is a partially omitted and enlarged cross-sectional side view illustrating the modified light-emitting device taken along line X–X' in FIG. 1 according to Embodiment 4 of the present invention.
Figure 5C:
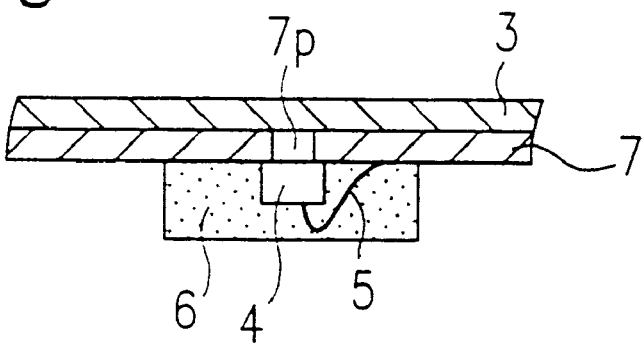
FIG. 5C is a partially omitted and enlarged cross-sectional side view illustrating another modified light-emitting device taken along line X–X' in FIG. 1 according to Embodiment 4 of the present invention.
Figure 6:
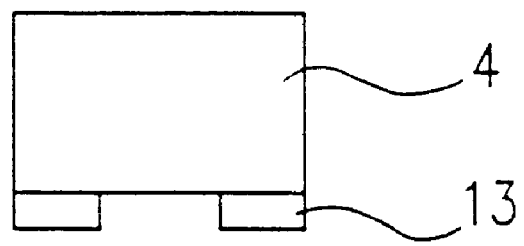
FIG. 6 is a side view illustrating an LED element used for an LED head in Embodiment 4 of the present invention.

FIG. 5A is a partially omitted and enlarged cross-sectional side view of an LED head as a light-emitting device according to Embodiment 4 of the present invention, which corresponds to the illustration taken along line X–X' in FIG. 1. FIGS. 5B and 5C are partially omitted and enlarged cross-sectional side views illustrating light-emitting devices directly mounted on wired plates 7. FIG. 6 is a side view of the LED element 4 shown in FIG. 5A.

Reference numeral 1 denotes a printed circuit board. Reference numeral 4 represents an LED element (only one element is illustrated for simplicity) sealed with a transparent resin sealant 6 as in the previous embodiments. Reference numeral 7 denotes a plate having light-passing areas 7p (only one area is illustrated for simplicity). The constituent material of the transparent resin sealant 6, the constituent material of the plate 7, and the opening diameter of the light-passing areas 7p are the same as those in the previous embodiments. Reference numeral 3 denotes a recording paper. Reference numeral 13 denotes a conductive adhesive or a micro-bump. The conductor pattern 10 provided on the printed circuit board 1 is not illustrated in FIG. 5A. Like components in the present embodiment are designated by like reference numerals as in the previous embodiments. Thus, the detailed descriptions thereof may be omitted herein.

Each of the LED elements 4 is placed at a predetermined position on the printed circuit board 1 as shown in FIG. 1. Specifically, as shown in FIG. 5A, the LED element 4 of FIG. 6 is electrically connected to the printed circuit board 1 at a predetermined position of the conductor pattern 10 using the conductive adhesive or micro-bump 13. Since a metal thin wire is not used for electrical connection of the LED element 4, the plate 7 having the light-passing areas 7p can be disposed closer to the light-emitting surface of the LED element 4.

Alternatively, the conductor pattern may be provided on the plate 7, and thus the printed circuit board 1 may be omitted. In such a case, the LED element 4 is electrically connected to the conductor pattern on the plate 7 (which is also referred as the wired plate 7 when used in the above manner) by being directly mounted thereon using the conductive adhesive or the micro-bump 13 as shown in FIG. 5B, or using the metal thin wire 5 as in FIG. 5C.

As described above, according to the present embodiment, the LED element 4 is electrically connected to the printed circuit board 1 or the wired plate 7 (i.e., to the conductor pattern provided thereon) directly by the conductive adhesive or the micro-bump 13. As a result, a distance between the light-emitting surface of the LED element 4 and the recording paper 3 can be shortened. Thus, radiant flux of light passed through the light-passing area is increased, thereby increasing radiation power on the recording paper 3.

(Embodiment 5)

Figure 7:
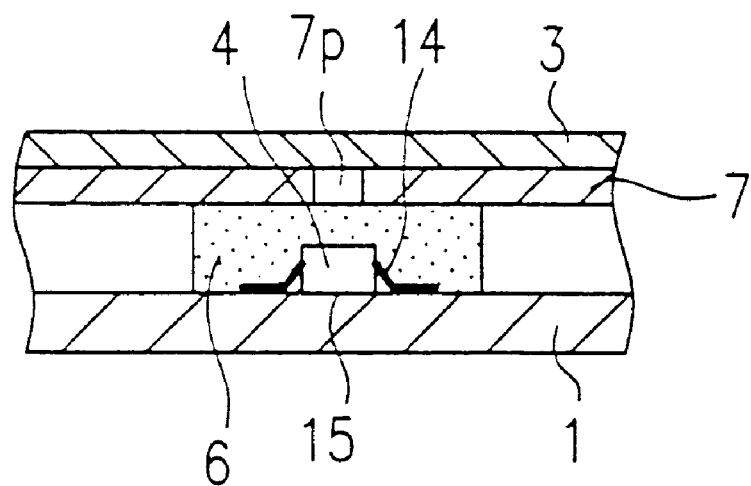
FIG. 7 is a partially omitted and enlarged cross-sectional side view of a light-emitting device taken along line X–X' in FIG. 1 according to Embodiment 5 of the present invention.

FIG. 7 is a partially omitted and enlarged cross-sectional side view of an LED head as a light-emitting device according to Embodiment 5 of the present invention, which corresponds to the illustration taken along line X–X' in FIG. 1.

Reference numeral 1 denotes a printed circuit board. Reference numeral 4 represents an LED element (only one element is illustrated for simplicity) sealed with a transparent resin sealant 6 as in the previous embodiments. Reference numeral 7 denotes a plate having light-passing areas 7p (only one area is illustrated for simplicity). The constituent material of the transparent resin sealant 6, the constituent material of the plate 7, and the opening diameter of the light-passing areas 7p are the same as those in the previous embodiments. Reference numeral 3 denotes a recording paper. Reference numeral 14 denotes a conductive adhesive. The conductor pattern 10 provided on the printed circuit board 1 is not illustrated in FIG. 7. Like components in the present embodiment are designated by like reference numerals as in the previous embodiments. Thus, the detailed descriptions thereof may be omitted herein.

Figure 8:
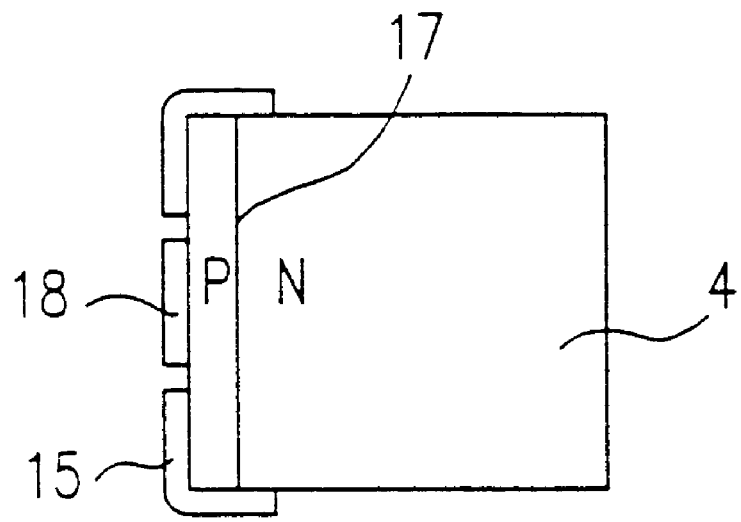
FIG. 8 is an enlarged cross-sectional view illustrating an LED element used for an LED head in Embodiment 5 of the present invention.

Each of the LED elements 4 is placed at a predetermined position on the printed circuit board 1. In order to eliminate a metal thin wire for electrical connection and thus shorten a distance between the light-emitting surface of the LED element 4 and the recording paper 3, the LED element 4 of FIG. 7 lies on its side with respect to the normal position when used, as shown in FIG. 8.

Moreover, a thin film is formed on the LED element 4 in order to prevent a P-type semiconductor region and an N-type semiconductor region of the LED element 4 from being short-circuited through the conductor pattern 10 when the LED element 4 is laid on its side. For example, oxide films 15 are provided at end portions of the LED element 4 so as to cover the P-type semiconductor region including a light-emitting region 17 but excluding a P-electrode 18.

The thus disposed LED element 4 is electrically connected to the conductor pattern 10 using the conductive adhesives 14, as shown in FIG. 7. Thus, there is no need to use a metal thin wire for electrical connection, and therefore, the plate 7 having the light-passing areas 7p can be disposed further closer to the light-emitting surface of the LED element 4.

As a transparent resin sealant 6, any one of those described in Embodiments 1 to 3 may be employed.

As described above, according to the present embodiment, since the LED element 4 is electrically connected to the conductor pattern 10 on the printed circuit board 1 with the conductive adhesives 14, a distance between the light-emitting surface of the LED element 4 and the recording paper 3 can be shortened. As a result, radiant flux of light passed through the light-passing areas 7p is increased, thereby increasing radiation power on the recording paper 3.

In each of the above-described embodiments, the printed circuit board 1 will be formed as follows. A standard-size sheet is provided and cut into a plurality of work-size sheets. In order to improve productivity and material yield and further to reduce the production cost, a plurality of conductor patterns respectively corresponding to the resultant devices are simultaneously formed on each of the work-size sheet. Thereafter, the work-size sheet is divided into a predetermined size at the end of the fabrication step.
(Embodiment 6)

Figure 9:
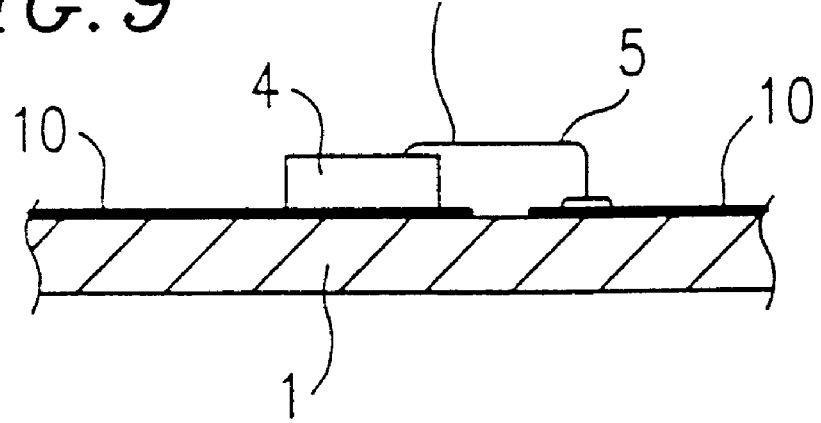
FIG. 9 is a view for illustrating a connection of a metal thin wire according to Embodiment 6 of the present invention.

FIG. 9 illustrates the configuration achieved in accordance with Embodiment 6 of the present invention, in which a primary connection side of a metal thin wire 5 for electrical connection of an LED element 4 is placed on a conductor pattern 10 of a printed circuit board 1, and a secondary connection side thereof is placed on an upper surface electrode of the LED element 4. It should be noted that although the other components are not illustrated in FIG. 9, like components are provided as in the previous embodiments.

The above-mentioned arrangement of the present embodiment allows a loop height of the metal thin wire 5 (measured from the printed circuit board 1) to be reduced, and thus the plate 7 (not shown in FIG. 9) can be disposed closer to the light-emitting surface of the LED element 4. As a result, radiant flux of light passed through the light-passing areas 7p (also not shown in FIG. 9) of the plate 7 is increased, thereby increasing radiation power on a recording paper.
(Embodiment 7)

Figure 10:
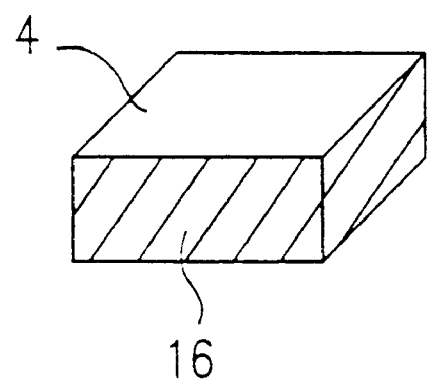
FIG. 10 is a schematic perspective view showing an LED element used for an LED head according to Embodiment 7 of the present invention.

FIG. 10 shows an LED element 4 in accordance with Embodiment 7 of the present invention, in which light-blocking films (light-shielding films) 16 are provided on the side surfaces and the bottom surface of the LED element 4. The light-blocking films 16 are formed, for example, by vapor deposition. This LED element 4 is arranged in the LED head (i.e., in the light-emitting device) as in the previous embodiments, although the other components are not illustrated in FIG. 10.

The light-blocking films 16 thus provided prevent light from emitting through the side and bottom surfaces of the LED element 4. Consequently, radiant flux directly above the LED element 4 is increased, allowing light emitted from the LED element 4 to be effectively utilized.
(Embodiment 8)

Figure 11:
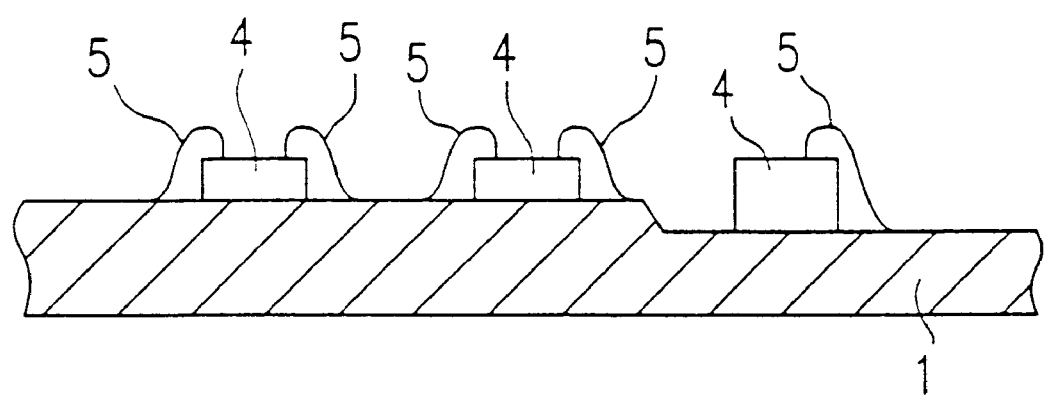
FIG. 11 is an enlarged cross-sectional view showing a printed circuit board and LED elements used for an LED head according to Embodiment 8 of the present invention.

FIG. 11 shows the case where LED elements 4 have different heights. In such a case, a position of the plate 7 to be provided as described in the previous embodiments (not shown in FIG. 11) is required to be adjusted based on the LED element 4 having the highest height (specifically, the rightmost LED element 4 in FIG. 11). However, in such an arrangement of the plate 7, there exist longer distances between the thus arranged plate 7 and the light-emitting surfaces (i.e., the upper surfaces) of the other LED elements 4 having lower heights. Consequently, the entire radiant flux emitted from the lower LED elements 4 cannot be effectively utilized.

In view of the above disadvantage, in the configuration of the present embodiment shown in FIG. 11, in order to place all the positions of the upper surfaces of the LED elements 4 at the same level, a difference in level is provided on a printed circuit board 1 at positions where the respective LED elements 4 are to be mounted in accordance with a difference in heights among the LED elements 4. As a result, light emitted from each of the LED elements 4 can be effectively utilized.

The thus provided printed circuit board 1 with the LED elements 4 is arranged in the LED head (i.e., in the light-emitting device) as in the previous embodiments, although the other components are not illustrated in FIG. 11.
(Embodiment 9)

Figure 12:
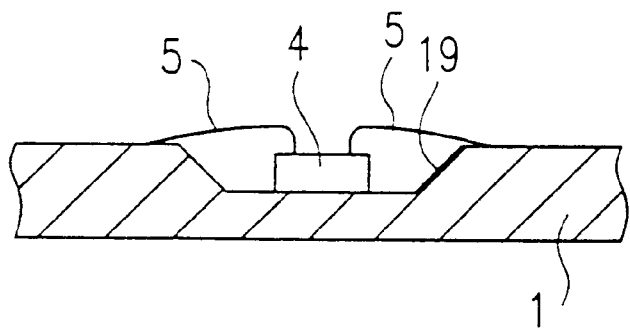
FIG. 12 is an enlarged cross-sectional view showing a printed circuit board and an LED element used for an LED head according to Embodiment 9 of the present invention.

FIG. 12 shows the case in which a concave portion 19 is provided in the printed circuit board 1 and the LED element 4 is provided therein. The surfaces of the concave portion 19 reflect light emitted from the LED element 4 towards the recording paper (not shown) to be provided in an upper direction in the figure. Thus, a utilization efficiency of the entire radiant flux emitted from the LED element 4 is improved.

As a material for the printed circuit board 1 in this case, aluminum, for example, is used. The concave portion 19 can be formed through a drawing process for the aluminum board 1 by stamping of a metal mold.

The thus provided printed circuit board 1 with the LED element 4 is arranged in the LED head (i.e., in the light-emitting device) as in the previous embodiments, although the other components are not illustrated in FIG. 12.
(Embodiment 10)

Figure 13:
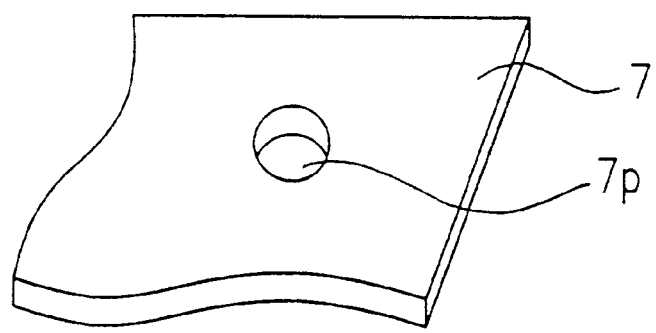
FIG. 13 is an enlarged perspective view showing a plate used for an LED head according to Embodiment 10 of the present invention.

FIG. 13 shows the plate 7 made of, for example, stainless steel. In this embodiment, the light-passing area 7p (for example, having a circular shape) with high dimensional accuracy can be easily formed by chemical etching of the stainless steel plate 7.

The thus provided stainless steel plate 7 is arranged in the LED head (i.e., in the light-emitting device) as in the previous embodiments, although the other components are not illustrated in FIG. 13.

It should be noted that the application of chemical etching for providing openings to function as the light-passing areas 7p is not limited to the plate 7 made of stainless steel. The chemical etching process is also applicable to a plate 7 made of other metal or resin material different from stainless steel.
(Embodiment 11)

Figure 14:
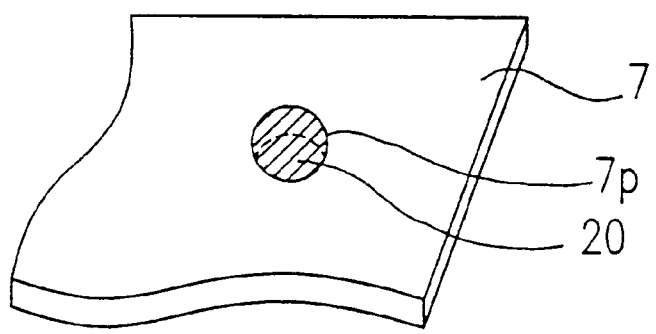
FIG. 14 is an enlarged perspective view showing a plate used for an LED head according to Embodiment 11 of the present invention.

The configuration in FIG. 14 differs from that in FIG. 13 in that the light-passing area 7p provided in the stainless steel plate 7 is sealed with glass or transparent resin 20. Accordingly, it is possible to prevent foreign materials from entering into the light-passing area 7p, or the light-passing area 7p from being clogged.

The thus provided stainless steel plate 7 is arranged in the LED head (i.e., in the light-emitting device) as in the previous embodiments, although the other components are not illustrated in FIG. 14.

The plate 7 in the above may be made of other metal or resin material different from stainless steel.
(Embodiment 12)

Figure 15:
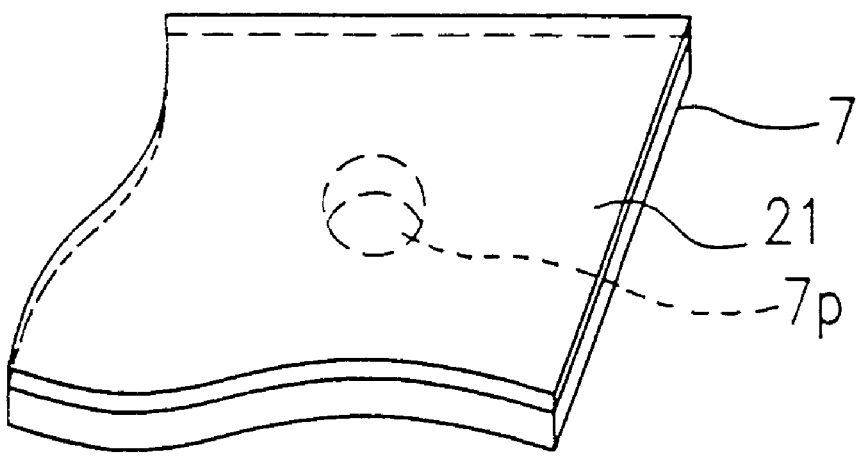
FIG. 15 is an enlarged perspective view showing a plate used for an LED head according to Embodiment 12 of the present invention.

In the configuration in FIG. 15, another plate or sheet 21 formed of a glass or transparent resin is provided on the plate 7. More specifically, another plate or sheet 21 is placed on the side of the plate 7 where a recording paper is to be disposed (also referred to as the light emitting direction from the LED element). Accordingly, it is possible to prevent foreign materials from entering into the light-passing area 7p, or the light-passing area 7p from being clogged.

The thus provided stainless steel plate 7 is arranged in the LED head (i.e., in the light-emitting device) as in the previous embodiments, although the other components are not illustrated in FIG. 15.

The plate 7 in the above may be made of other metal or resin material different from stainless steel.
(Embodiment 13)

Figure 16:
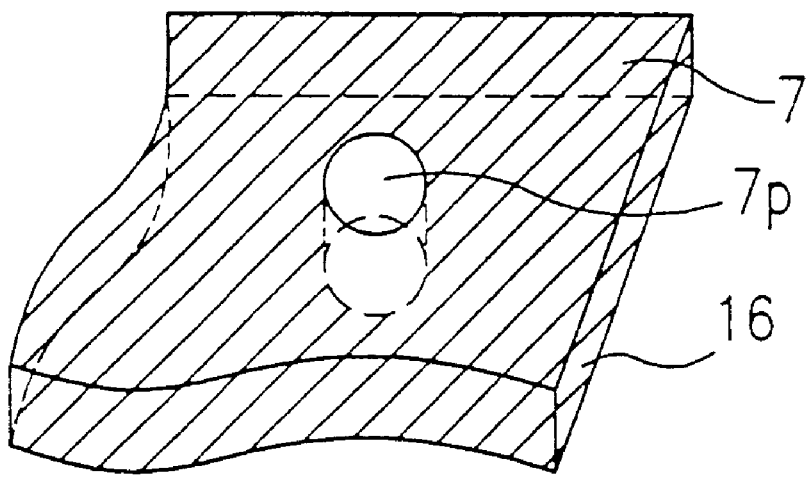
FIG. 16 is an enlarged perspective view showing a plate used for an LED head according to Embodiment 13 of the present invention.

FIG. 16 shows the plate 7 made of glass or transparent resin. In this case, a light-blocking film 16 is formed on the surface or inside of the glass or transparent resin plate 7 except for a predetermined 46 region for functioning as the light-passing area 7p so that light is allowed to pass only through the region (i.e., the light-passing area 7p).

Alternatively, the plate 7 can be formed using a an opaque material and a transparent material (e.g., glass or transparent resin) in such a manner that a predetermined region for functioning as the light-passing area 7p is formed of the transparent material so as to allow light to pass therethrough while the remaining part of the plate 7 is made of the opaque material so as to block light.

Accordingly, it is possible to prevent foreign materials from entering into the light-passing area 7p, or the light-passing area 7p from being clogged. The thus provided stainless steel plate 7 is arranged in the LED head (i.e., in the light-emitting device) as in the previous embodiments, although the other components are not illustrated in FIG. 16.
(Embodiment 14)

Figure 17A:
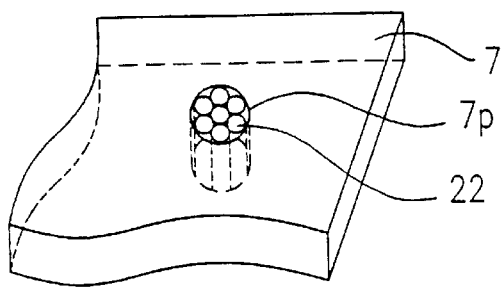
FIG. 17A is an enlarged perspective view showing a plate used for an LED head according to Embodiment 14 of the present invention.
Figure 17B:
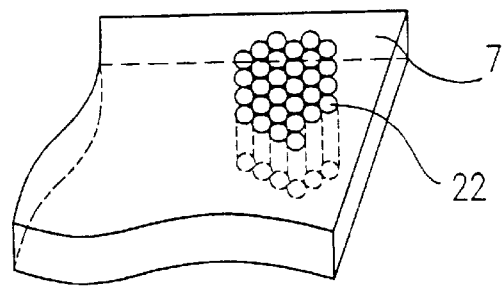
FIG. 17B is an enlarged perspective view showing another plate used for the LED head according to Embodiment 14 of the present invention.

FIG. 17A shows the case where the light-passing area 7p of the plate 7 is formed using optical fibers 22. FIG. 17B shows the case where the whole plate 7 is entirely formed using the optical fibers 22 (although only a portion of the optical fibers 22 is shown in FIG. 17B). The optical fibers 22, each having a core 24 and a clad 25 as in common optical fibers, are disposed in a direction perpendicular to a printed circuit board 1 (to be provided as in the previous embodiments, although not shown herein), as shown in FIG. 17C.

The optical fibers 22 are formed as follows. A plurality of thin optical fibers with a diameter of, for example, about 25 to 50 $\mu$m are bundled in the same direction and then thermally welded together to be processed in a rectangular parallelopiped shape. Then, the processed bundled fibers are cut in a desired size, and the respective cut surfaces are subjected to a mirror-finish treatment to complete the preparation.

Figure 17C:
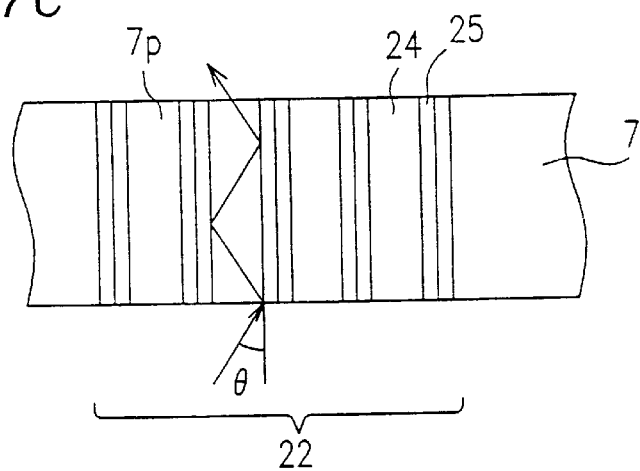
FIG. 17C is a view for describing the plate according to Embodiment 14 of the present invention.

As shown in FIG. 17C, among lights emitted from the LED element 4 (not shown) in all directions, some light is trapped by the optical fiber 22 when an angle $\theta$ formed by the light and the optical axis of the optical fiber 22 is equal to or less than a certain value (i.e., within an opening angle of the optical fiber 22). The trapped light is led into the optical fiber 22 to propagates through the core 24 with repeated total reflection. Since the light propagates through the optical fiber 22 with little attenuation, transmission loss therein (i.e., in the plate 7) is extremely low.

The outgoing light from the optical fibers 22 becomes substantially parallel rays as if emitted from a beam-shaped light source. Such parallel outgoing rays hardly attenuate due to deviations in lifted positions of the recording paper 3 (not shown), thereby realizing excellent distance characteristics upon recording onto the recording paper. Accordingly, when the plate 7 thus formed using the fibers 22 in its light-passing area 7p is used in the recording device, the recording paper 3 can be effectively irradiated, resulting in the significantly improved irradiation characteristics.

Light which is not trapped by the optical fibers 22 becomes stray light within the plate 7, thereby becoming unnecessary light which is not involved in exposure through the light-passing area 7p. Leakage of the light which is not trapped by the optical fibers 22 thus occurs.

Figure 18A:
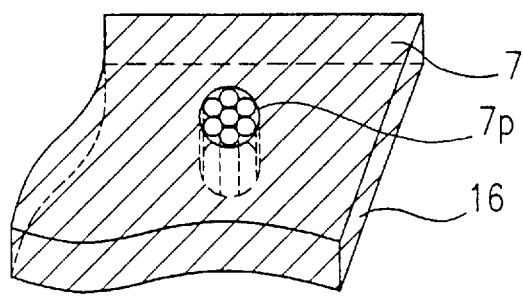
FIG. 18A is an enlarged perspective view showing still another plate used for the LED head according to Embodiment 14 of the present invention.
Figure 18B:
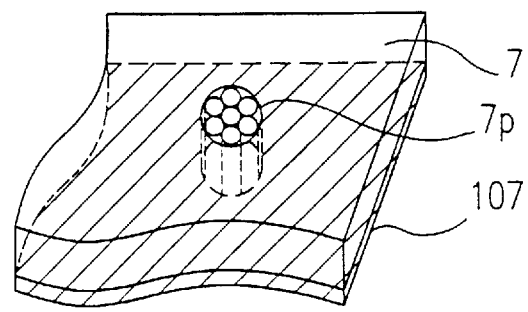
FIG. 18B is an enlarged perspective view showing still another plate used for the LED head according to Embodiment 14 of the present invention.

Although not shown in FIG. 17A or 17B, in order to completely prevent such leakage of light, an area excluding the light-passing area 7p on the plate 7 may be shielded by using a light-blocking film or an opaque material 16 as shown in FIG. 18A. Alternatively, as shown in FIG. 18B, another plate 107 prepared in the manner described in Embodiments 9–13 may be further provided to be combined with the plate 7.

The thus provided configuration is arranged in the LED head (i.e., in the light-emitting device) as in the previous embodiments, although the other components are not illustrated in FIGS. 17A through 18B.
(Embodiment 15)

Figure 19:
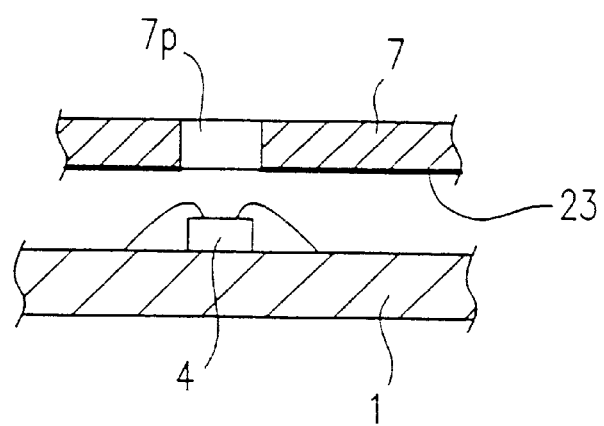
FIG. 19 is a cross-sectional view illustrating a main portion of a light-emitting device used for an LED head according to Embodiment 15 of the present invention.

FIG. 19 shows the case where an antireflection coating layer 23 is applied onto the surface of the plate 7 facing the printed circuit board 1 (i.e., the LED element 4). Accordingly, light emitted from the LED element 4 can effectively enter into the light-passing area 7p of the plate 7.

The thus provided plate 7 is arranged in the LED head (i.e., in the light-emitting device) as in the previous embodiments, although the other components are not illustrated in FIG. 19.
(Embodiment 16)

Figure 20A:
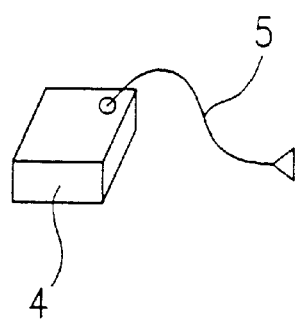
FIG. 20A is a schematic perspective view showing an LED element used for an LED head according to Embodiment 16 of the present invention.
Figure 20B:
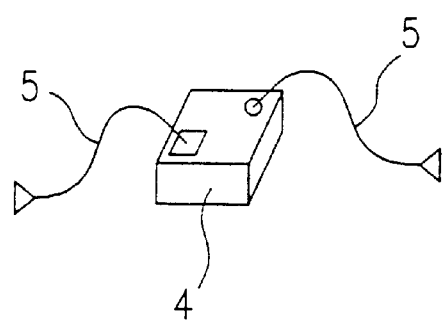
FIG. 20B is a schematic perspective view showing another LED element used for the LED head according to Embodiment 16 of the present invention.

FIGS. 20A and 20B respectively show the configurations of the LED elements 4 to be used in the previous embodiments of the present invention.

In the present invention, three LED elements 4 each emitting one of the three primary colors (R, G, and B) are arranged as a set. As the R-LED, a GaAlAs-type LED element, for example, is used.

Typically, an electrode of the conventional GaAlAs-type R-LED element onto which a metal thin wire is to be connected is disposed at the center area of the element. Thus, when the light-passing area is disposed in proximity to the conventional GaAlAs-type R-LED element, the center position of the electrode and that of the light-passing area are overlapped, resulting in the deteriorated light-incidence efficiency onto the light-passing area.

In order to cope with the above disadvantage, as shown in FIG. 20A, the electrode, onto which the wire 5 is to be connected, of the GaAlAs-type R-LED element 4 is disposed with a position offset from the center of the element 4 so as to place the light-emitting surface of the element 4 directly under the light-passing area 7p (not shown in FIG. 20A).

It should be noted that in the case in the B-LED element or the G-LED element, the light-emitting surfaces thereof are typically positioned so as to correspond to the centers of the upper surfaces of the elements 4. Thus, the electrodes of the typical G-LED and B-LED elements 4, onto which the wires 5 are to be connected, are generally provided at a position offset from the centers of the upper surfaces of the R-LED or B-LED elements 4, as shown in FIG. 20B. Thus, the light-emitting surfaces thereof are positioned under the light-passing area without adversely affected by the electrodes 5, so that the light-incidence efficiency onto the light-passing areas 7p is not deteriorated.

The thus LED elements 4 are arranged in the LED head (i.e., in the light-emitting device) as in the previous embodiments, although the other components are not illustrated in FIGS. 20A and 20B.

(Embodiment 17)

Figure 21:
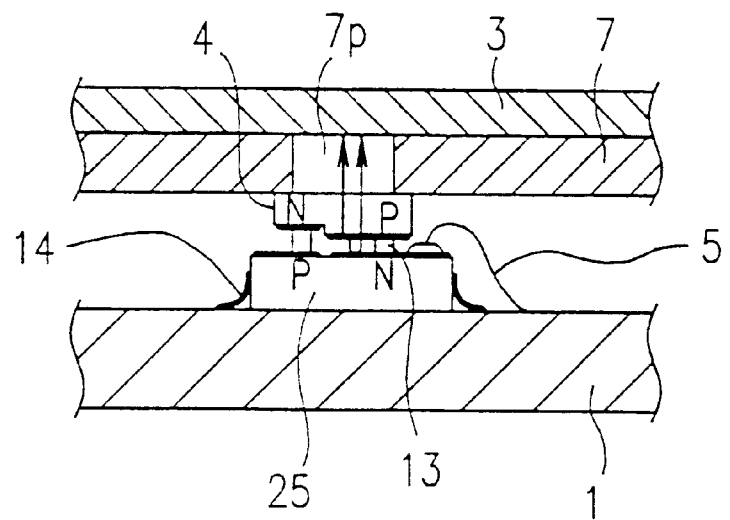
FIG. 21 is an enlarged cross-sectional view showing an LED element used for an LED head according to Embodiment 17 of the present invention.

FIG. 21 shows the configuration of an LED head as a light-emitting device in accordance with Embodiment 17 of the present invention, and in particular, the case in which a GaN type LED element, for example, is used as an LED element 4, and a diode element 25 is connected to the LED element 4 in a flip-flop manner as a protecting component against damage due to electrostatic discharge.

Reference numeral 1 denotes a printed circuit board. Reference numeral 7 denotes a plate having light-passing areas 7p (only one area is illustrated for simplicity). The constituent material of the plate 7 and the opening diameter of the light-passing areas 7p are the same as those in the previous embodiments. The conductor pattern 10 provided on the printed circuit board 1 is not illustrated in FIG. 21. Like components in the present embodiment are designated by like reference numerals as in the previous embodiments. Thus, the detailed descriptions thereof may be omitted herein.

The diode element 25 includes two sections which are electrically connected to a P-type semiconductor region and an N-type semiconductor region of the LED element 4, respectively. When a predetermined voltage equal to or less than breakdown voltage of the LED element 4 is applied across the P-type semiconductor region and the N-type semiconductor region of the LED element 4, a current flows between the above-described two sections of the diode element 25, so that the LED element 4 is protected from being damaged by ESD.

Specifically, a P-electrode and an N-electrode of the LED element 4 are connected to an N-electrode and a P-electrode of the diode element 25, respectively, via micro-bumps 13 in the overlapping state, i.e., in a flip-flop manner. The aforementioned two sections of the diode element 25 are provided inside thereof and are electrically connected to the N-electrode and the P-electrode of the diode element 25.

The diode element 25 is attached to the printed circuit board 1 with the conductive adhesive 14. One electrode of the diode element 25 is electrically connected to the conductor pattern on the printed circuit board 1 upon mounting onto the board 1, while another electrode of the diode element 25 is electrically connected to the conductor pattern with the metal thin wire 5. On the other hand, the LED element 4 is disposed over the diode element 25 so as to come into contact with the plate 7.

The LED element 4 is formed using a transparent substrate. Thus, light emitted from the light-emitting section of the LED element 4 transmits through the substrate, and further passes through the light-emitting area 7p of the plate 7, as indicated by arrows in FIG. 21. Light leaked in the downward direction from the LED element 4 is reflected by the electrodes formed on the upper surface of the diode element 25 in regions approximately corresponding to the light-emitting region of the LED element 4. Then, the thus reflected light also transmits through the LED element 4 and further passes through the light-passing area 7p of the plate 7.

In the thus structured LED head in FIG. 21, the LED element 4 is provided so as to be in contact with the plate 7. This enables a distance between the light-emitting surface of the LED element 4 and the recording paper 3 to be further shortened. Furthermore, both the light emitted in the upward direction from the LED element 4 and the light emitted in the downward direction therefrom to be then reflected from the diode element 25 pass through the light-passing area 7p. Thus, radiant flux of light passed through the light-passing area 7p is increased, and radiation power on the recording paper 3 can be increased.

Moreover, the diode element 25 provided in the above manner provides the light-emitting device with an excellent ESD protection function. In other words, the diode element 25 thus provided functions as an ESD protection component for the LED head (i.e., for the light-emitting device) of the present invention.

(Embodiment 18)

Figure 22:
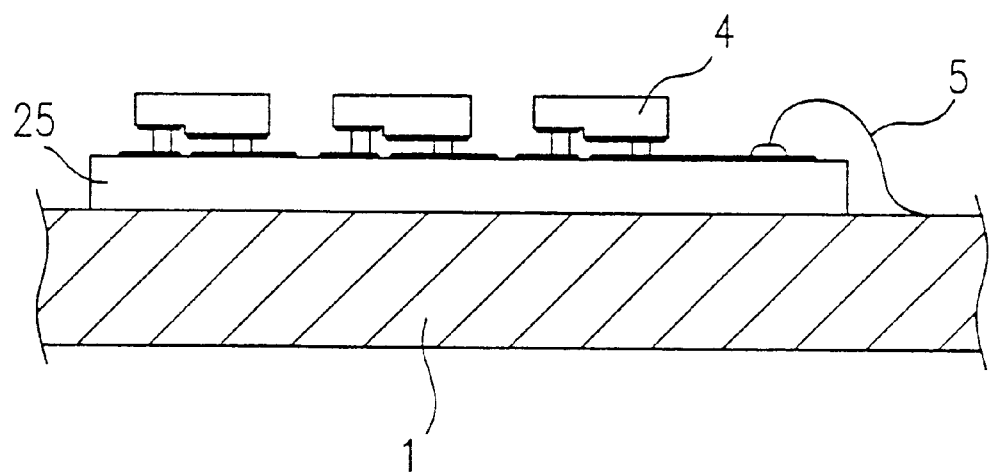
FIG. 22 is an enlarged cross-sectional view showing LED elements used for an LED head according to Embodiment 18 of the present invention.

FIG. 22 shows the case where a plurality of the LED elements 4 are connected onto one diode element 25 formed on one substrate (for example, on a silicon board) which exhibits the function as described in Embodiment 17 of the present invention. The diode element 25 is in turn provided on the printed circuit board 1.

In such a configuration, the number of dicing processes required for forming the diode element 25 is reduced since the common diode element 25 is employed for a plurality of the LED elements 4. In addition, only one metal thin wires 5 is required for electrical connection of the diode element 25. Moreover, the mounting space can be reduced.

Alternatively, a plurality of the diode elements 25 may be provided on one substrate. Even in such a case, the handling of the diode elements 25 is facilitated since they are provided on a single substrate.

The thus provided structure is arranged in the LED device (i.e., in the light-emitting device) as in the previous embodiments, although the other components are not illustrated in FIG. 22.

(Embodiment 19)

Figure 23:
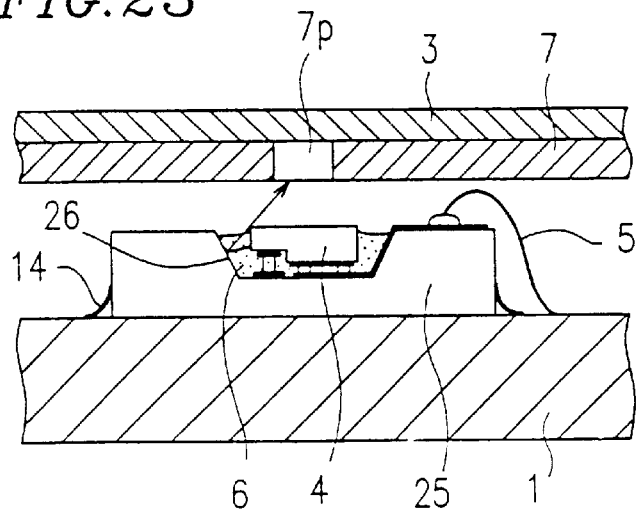
FIG. 23 is an enlarged cross-sectional view showing an LED element used for an LED head according to Embodiment 19 of the present invention.

FIG. 23 shows an LED head as a light-emitting element in accordance with Embodiment 19 of the present invention, which is similar to that illustrated in FIG. 21 to some extent. Differences are that the diode element 25 in FIG. 23 has a concave portion 26 and the LED element 4 is provided in the concave portion 26. The concave portion 26 functions as a reflector for reflecting light from the LED element 4.

For example, light emitted from the side surface of the LED element 4 is reflected from a slant side face of the concave portion 26 to be directed to the light-passing area 7p of the plate 7, as indicated by an arrow in FIG. 23.

Moreover, the concave portion 26 of the diode element 25 is sealed by a resin, preferably of high reflectance. This results in an enhanced reflectance from the diode element 25 with respect to the light emitted from the LED element 4, and therefore, radiation power on the recording paper 3 can be increased.

In FIG. 23, reference numeral 1 denotes a printed circuit board. Reference numerals 5 and 14 represent the thin metal wire and the conductive adhesive, respectively. The constituent material of the plate 7 and the opening diameter of the light-passing areas 7p are the same as those in the previous embodiments. Like components in the present embodiment are designated by like reference numerals as in the previous embodiments. Thus, the detailed descriptions thereof may be omitted herein.

(Embodiment 20)

Figure 24A:
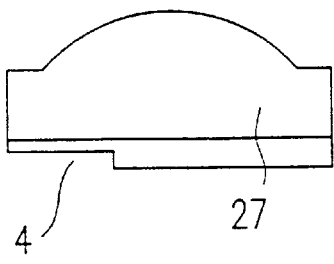
FIG. 24A is a schematic side view of an LED element used for an LED head according to Embodiment 20 of the present invention.
Figure 24B:
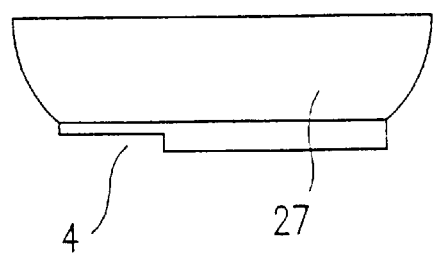
FIG. 24B is a schematic side view showing another LED element used for the LED head according to Embodiment 20 of the present invention.

FIG. 24A shows a different exemplary configuration of the LED element 4 in which the transparent substrate 27 included therein has a dome shape. FIG. 24B shows another different exemplary configuration of the LED element 4 in which the transparent substrate 27 included therein has a bowl shape. The LED element 4 having such a shape can be arranged in the LED head (i.e., in the light-emitting device) as in the previous embodiments, although the other components are not illustrated in FIG. 24A or 24B.

Due to the dome-shaped or bowl-shaped transparent substrate 27 of the LED element 4, light emitted therefrom can be effectively converged into the light-passing area of the plate (not shown) to be provided as in the previous embodiments. As a result, radiant flux of light passed through the light-passing area of the plate is increased, thereby increasing radiation power on the recording paper 3.

(Embodiment 21)

Figure 26A:
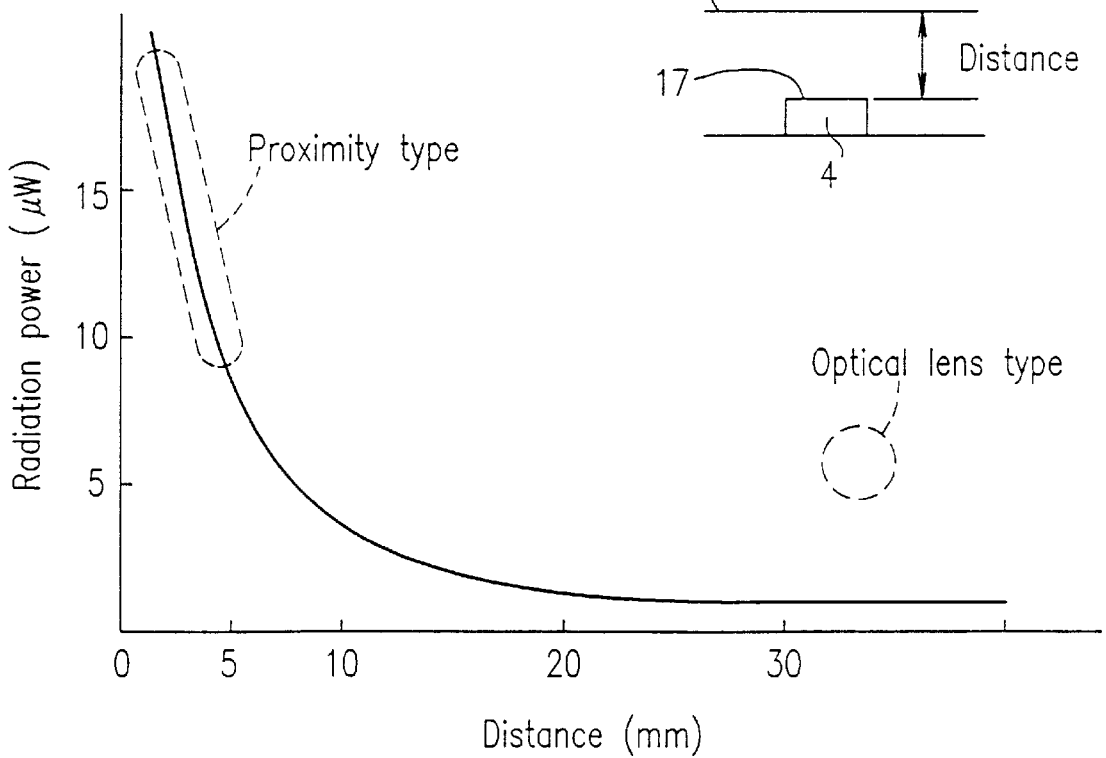
FIG. 26A is a diagram illustrating a relationship between radiation power on a recording paper and a distance according to the light-emitting device of the present invention and such a relationship according to a conventional light-emitting device.
Figure 26B:
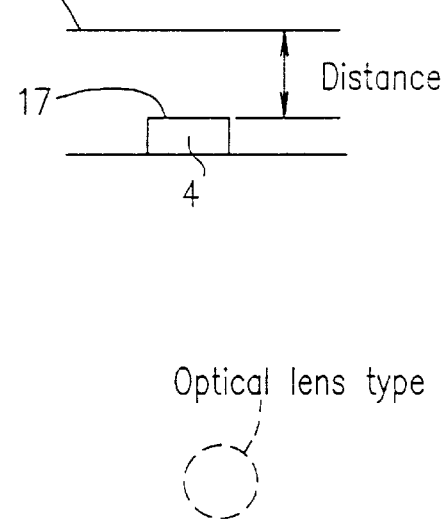
FIG. 26B is a view indicating the distance between the LED element and the recording paper.
Figure 27:
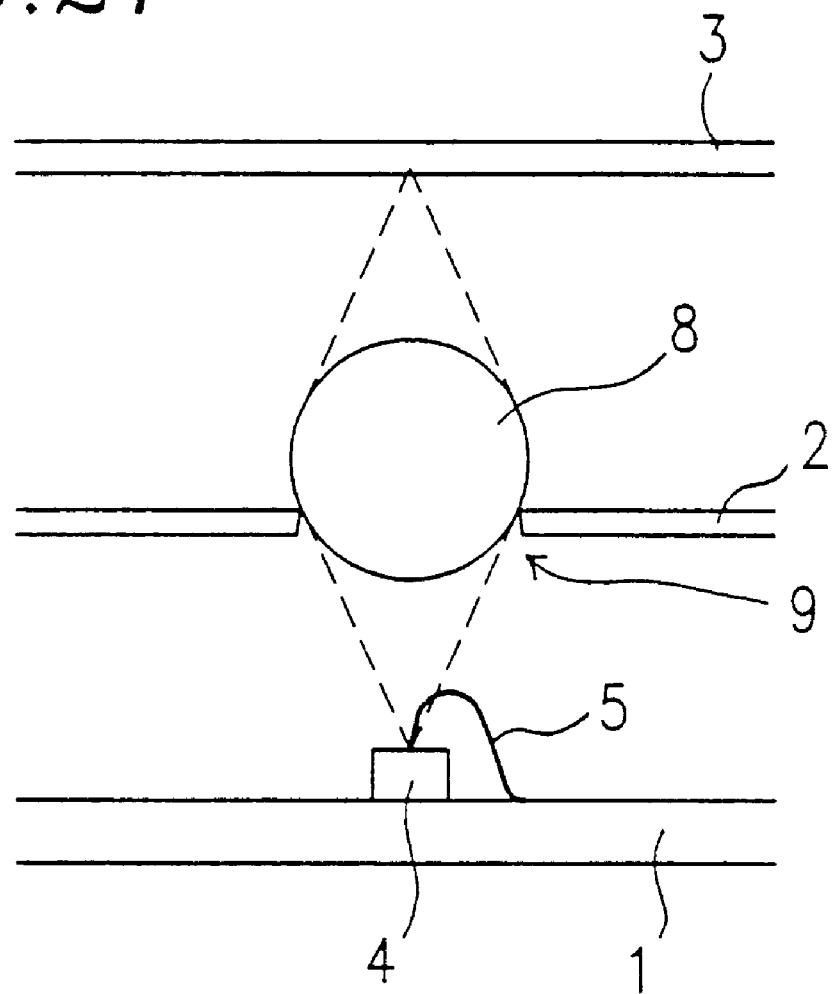
FIG. 27 is an enlarged cross-sectional side view for illustrating the main portion of a printing head unit according to the exemplary conventional light-emitting device.

FIG. 26A is a graph illustrating a relationship between radiation power on the recording paper 3, which is obtained by light emitted from a light-emitting section 17 of the LED element 4 as a light-emitting element, and a distance between the LED element 4 and the recording paper 3. Such a distance is indicated in FIG. 26B. The light-emitting section 17 herein refers to a junction between a P-electrode and an N-electrode of the LED element 4.

FIG. 26A indicates that when the distance between the light-emitting section 17 of the LED element 4 and the recording paper 3 is about 5 mm or less, the radiation power is significantly improved. Thus, as shown in FIG. 25, the recording device of the present invention, which employs the light-emitting device as described in the previous various embodiments, is configured as a proximity-type device in which the distance between the light-emitting section 17 of the LED element 4 provided on the printed circuit board 1 and the recording paper 3 is about 5 mm or less.

Figure 25:
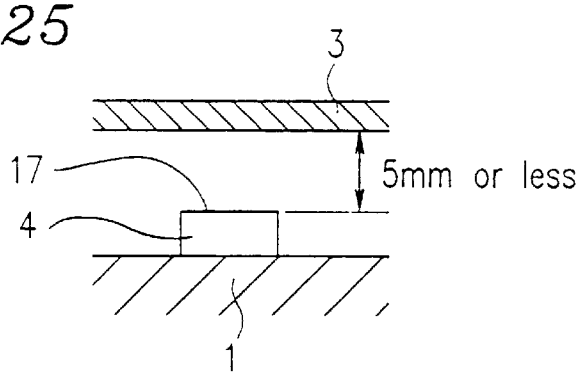
FIG. 25 is a view for describing positional relationships between an LED element and a recording paper of a recording device according to the present invention.

It should be noted that in FIGS. 25 and 26B, the plate 7 having the light-passing areas 7p previously explained is not shown for simplicity.

The basic operation and printing principle of the thus structured LED head (i.e., the recording device using the same) of the present invention are substantially the same as those in the conventional LED head (the recording device).

More specifically, a digital image is divided into image data each corresponding to one pixel (i.e., the pixel image data), and the pixel image data is converted into a color map. Then, the color map is converted into digital signals each of which is assigned for each pixel. The LED elements 4 emit light in accordance with the transmitted digital signals so as to be focused upon a pixel on the recording paper 3 via the light-passing areas 7p of the plate 7 located above each of the LED elements 4. Radiation power of the incident light on the recording paper 3 causes the micro-capsules thereon to be exposed and photosensitized. The writing of an image is performed for all of the pixels on the recording paper 3 by sequentially exposing and photosensitizing the recording paper 3 in the above manner.

The primary objective of the present embodiment is to improve an utilization efficiency of light emitted from the LED elements 4. As shown in FIG. 26A, according to the proximity-type recording device of the present invention, radiation power on the recording paper 3 is about 2.5 times larger than that in the conventional lens optical system. Thus, exposure time is shortened, thereby realizing a reduction in the printing time. Moreover, when the printing time is set to be the same as that in the conventional recording device, the number of the required LED elements 4 can be reduced since the required amount of exposure on the recording paper is constant. As a result, production cost can be reduced.

Moreover, the thickness of the LED head is reduced from about 20 mm to about 2 mm (i.e., the thickness is reduced to about 1/10 of that of the conventional LED head). Accordingly, a light-weight and miniaturized LED head is realized.

Furthermore, a desired level of resolution can be easily set by changing a diameter of the light-passing areas. In addition, a change in a spot diameter due to color aberration resulting from differences among wavelengths of the three primary colors of the LED elements 4 is eliminated. Thus, resolution can be kept constant among the wavelengths, thereby realizing the improvement in the printing quality.

As described above, according to the present invention, the proximity-type method in which the LED elements are placed closer to the printing paper is employed. As a result, of the total amount of the radiant flux of the LED, radiation power on the recording paper by radiant flux of light passed through the light-passing areas can be raised. Thus, time required for exposing the recording paper can be reduced, thereby realizing a reduction in printing time which is demanded by the market. Alternatively, when an exposure time in the recording device of the present invention is set to be the same as that in the conventional recording device, the number of LED elements required can be reduced since radiation power onto the recording paper is high. As a result, production cost can be reduced.

Moreover, according to the present invention, a long optical path as required in the conventional lens optical system is not required. Furthermore, a lightweight and miniaturized device can be provided since no lens is used, and cost reduction can be achieved due to a reduction in the number of parts to be assembled. In addition, since focus control of the lens system and high assembly accuracy are not required, the number of assembly steps can be reduced.

Furthermore, a desired level of resolution can be easily set by changing a diameter of the light-passing areas. In addition, a change in a spot diameter due to color aberration resulting from differences among wavelengths of the three primary colors of the LED elements is eliminated. Thus, resolution can be kept constant among the wavelengths, thereby realizing the improvement in the printing quality.

Furthermore, by providing the ESD protecting device (such as a diode element) to be connected to the light-emitting element (such as an LED element), a highly reliable light-emitting device having a protection function against breakdown due to ESD or the like, and a recording device using the same, can be obtained.

In some of the embodiments of the present invention described in the above, the plate 7 having the light-passing areas 7p is explained as the stainless steel plate 7. It should be noted that a plate 7 made of other metal or resin material different from stainless steel can also employed in place of the stainless steel plate 7.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light-emitting device, comprising:
   a first plate provided with a conductor pattern thereon;
   a plurality of light-emitting elements disposed at predetermined portions on the first plate, respectively; and
   a plurality of light-passing structures provided so as to respectively correspond to the plurality of light-emitting elements,
   wherein the respective light-emitting elements are sealed with a transparent resin sealant;
   wherein a second plate is further disposed in a direction perpendicular to the direction of light from the light-emitting elements; and
   wherein the second plate is provided with a plurality of openings, each having a diameter of 1 mm or less, so as to respectively correspond to the plurality of light-emitting elements, the plurality of openings functioning as the plurality of light-passing structures.

2. A light-emitting device according to claim 1, wherein:
   the first plate is a printed circuit board.

3. A light-emitting device according to claim 1, wherein each of the light-emitting elements is arranged such that a center of a light-emitting surface thereof is substantially aligned with a center line of the corresponding light-passing structure.

4. A light-emitting device according to claim 1, wherein an upper surface of a seal structure formed by the transparent resin sealant is a flat surface.

5. A light-emitting device according to claim 4, wherein the upper surfaces of the respective seal structures corresponding to the respective light-emitting elements are positioned at the same level.

6. A light-emitting device according to claim 1, wherein the transparent resin sealant is formed into a predetermined shape by molding process using a mold.

7. A light-emitting device according to claim 6, wherein the molding process using a mold is a transfer molding process.

8. A light-emitting device according to claim 1, wherein the transparent resin sealant is formed by selective adhesion.

9. A light-emitting device according to claim 2, further comprising a substrate or a molded member, on the printed circuit board, in which hollows are provided at positions at which the respective light-emitting elements are to be disposed.

10. A light-emitting device according to claim 9, wherein the respective light-emitting elements provided in the hollows of the substrate or the molded member are sealed with a transparent resin sealant which is formed into a predetermined shape by a molding process using a mold or formed by injecting a transparent resin into the respective hollows.

11. A light-emitting device according to claim 2, wherein:
    the respective light-emitting elements are sealed with a transparent resin sealant; and
    the printed circuit board and the second plate are arranged so as to face each other with the plurality of light-emitting elements interposed therebetween, a distance between the facing printed circuit board and second plate being substantially equal to a thickness of the transparent resin sealant.

12. A light-emitting device according to claim 1, wherein the transparent resin sealant is made of an epoxy resin or a silicone resin.

13. A light-emitting device according to claim 1, wherein each of the light-emitting elements comprises:
    a transparent substrate;
    a P-type semiconductor region and an N-type semiconductor region provided in the transparent substrate;
    a P-electrode electrically connected to the P-type semiconductor region; and
    an N-electrode electrically connected to the N-type semiconductor region,
    wherein the P-electrode and the N-electrode are formed on the same surface of the light-emitting element to be electrically connected to the conductor pattern on the first plate, respectively.

14. A light-emitting device according to claim 13, wherein the transparent substrate has a curved shape.

15. A light-emitting device according to claim 13, wherein electrical connections between the P-electrode and the conductor pattern and between the N-electrode and the conductor pattern are established using a conductive adhesive or a micro-bump.

16. A light-emitting device according to claim 13, wherein each of the light-emitting elements includes a thin film provided at an end portion thereof including a light-emitting region but excluding the P-electrode, the light-emitting element being arranged such that a pn-junction thereof is arranged substantially perpendicular to the first plate and is electrically connected to the conductor pattern on the first plate using a conductive adhesive.

17. A light-emitting device according to claim 1, wherein each of the light-emitting elements is electrically connected to the conductor pattern on the first plate with a thin metal wire, a connecting point between the thin metal wire and the conductor pattern functioning as a primary connection of the thin metal wire, and a connecting point between the thin metal wire and the light-emitting element functioning as a secondary connection of the thin metal wire.

18. A light-emitting device according to claim 2, wherein the printed circuit board is provided with steps at positions at which the respective light-emitting elements are disposed, each of the steps having a size in accordance with a height of the corresponding light-emitting element.

19. A light-emitting device according to claim 2, wherein the printed circuit board is provided with at least one concave portion, and at least one of the light-emitting elements is provided therein.

20. A light-emitting device according to claim 2, wherein the second plate is made of metal or resin, and the plurality of openings are formed by a chemical etching process.

21. A light-emitting device according to claim 2, wherein the second plate is made of metal or resin, and the plurality of openings are sealed with a glass or a transparent resin.

22. A-light-emitting device according to claim 2, wherein:
    the second plate is made of metal or resin; and
    a third plate or sheet made of a glass or a transparent resin is further provided in a light-emitting direction of the light-emitting elements with respect to the second plate.

23. A light-emitting device according to claim 1, wherein:
    the first plate is a printed circuit board;
    a second plate made of a glass or a transparent resin is further disposed in a light-emitting direction of the light-emitting elements; and
    the second plate is provided with a plurality of predetermined regions, each having a diameter of 1 mm or less, so as to function as the plurality of light-passing structures.

24. A light-emitting device according to claim 1, wherein:
    the first plate is a printed circuit board;

a second plate made of a glass or a transparent resin is further disposed in a light-emitting direction of the light-emitting elements; and the second plate is provided with a plurality of predetermined regions, each having a diameter of 1 mm or less and being constituted using optical fibers, so as to function as the plurality of light-passing structures.

25. A light-emitting device, comprising:

a first plate provided with a conductor pattern thereon;

a plurality of light-emitting elements disposed at predetermined portions on the first plate, respectively; and a plurality of light-passing structures provided so as to respectively correspond to the plurality of light-emitting elements, wherein the respective light-emitting elements are sealed with a transparent resin sealant, and wherein the plurality of light-passing structures are provided in the first plate so as to correspond to positions at which the respective light-emitting elements are disposed.

26. A light-emitting device, comprising:

a first plate provided with a conductor pattern thereon;

a plurality of light-emitting elements disposed at predetermined portions on the first plate, respectively; and a plurality of light-passing structures provided so as to respectively correspond to the plurality of light-emitting elements, wherein the respective light-emitting elements are sealed with a transparent resin sealant, wherein the first plate is a printed circuit board;

wherein a second plate constituted using optical fibers is further disposed in a light-emitting direction of the light-emitting elements; and wherein the second plate is provided with a plurality of predetermined regions, each having a diameter of 1 mm or less, so as to function as the plurality of light-passing structures.

27. A light-emitting device comprising:

a first plate provided with a conductor pattern thereon;

a plurality of light-emitting elements disposed at predetermined portions on the first plate, respectively; and a plurality of light-passing structures provided so as to respectively correspond to the plurality of light-emitting elements, wherein the respective light-emitting elements are sealed with a transparent resin sealant, and the first plate is a printed circuit board;

the second plate is further disposed in a direction perpendicular to the direction of light from the light-emitting elements; and the second plate is provided with a plurality of openings, each having a diameter of 1 mm or less, so as to respectively correspond to the plurality of light-emitting elements, the plurality of openings functioning as the plurality of light-passing structures; and an antireflection coating layer is provided on a surface of the second plate which opposes the light-emitting elements.

28. A light-emitting device according to claim 1, wherein each of the light-emitting elements is a light-emitting diode element.

29. A light-emitting device according to claim 28, wherein the light-emitting diode element emits light having a wavelength in one of a red color region, a green color region, or a blue color region.

30. A light-emitting device according to claim 29, wherein the light-emitting diode element emitting light having a wavelength in the red color region has an electrode on an upper surface thereof with a position offset from a center of the upper surface.

31. A light-emitting device, comprising:

a first plate provided with a conductor pattern thereon;

a plurality of light-emitting elements disposed at predetermined portions on the first plate, respectively; and a plurality of light-passing structures provided so as to respectively correspond to the plurality of light-emitting elements, wherein the respective light-emitting elements are sealed with a transparent resin sealant, wherein each of the light-emitting elements is a light emitting diode element, and wherein at least one of a bottom surface and side surfaces of the light-emitting diode element is subjected to a light blocking treatment.

32. A light-emitting device, comprising:

a first plate provided with a conductor pattern thereon:

a plurality of light-emitting elements disposed at predetermined portions on the first plate, respectively; and a plurality of light-passing structures provided so as to respectively correspond to the plurality of light-emitting elements, wherein the respective light-emitting elements are sealed with a transparent resin sealant, wherein each of the light-emitting elements comprises:

an insulative transparent substrate; and a P-type semiconductor region and an N-type semiconductor region provided in the transparent substrate, and wherein each of the light-emitting elements is electrically connected to an ESD protection component which has a first region and a second region electrically connected to the P-type semiconductor region and the N-type semiconductor region, respectively, so as to be configured such that an electrical current flows between the first region and the second region when a voltage equal to or less than a breakdown voltage between the P-type semiconductor region and the N-type semiconductor region is applied thereacross.

33. A light-emitting device according to claim 32, wherein the transparent substrate has a curved shape.

34. A light-emitting device according to claim 32, wherein the respective light-emitting elements and the ESD protection component are electrically connected by a micro-bump.

35. A light-emitting device according to claim 32, wherein two or more of the light-emitting elements are electrically connected to a single ESD protection component.

36. A light-emitting device according to claim 32, wherein a plurality of the ESD protection components respectively corresponding to the light-emitting elements are provided on a single substrate.

37. A light-emitting device according to claim 32, wherein the ESD protection component has a reflection structure for reflecting light emitted from the light-emitting element.

38. A light-emitting device according to claim 37, wherein the reflection structure is a concave portion which is sealed with a resin.

39. A light-emitting device according to claim 32, wherein the ESD protection component has an electrode configured so as to reflect light emitted from the light-emitting element into a predetermined direction.

40. A light-emitting device according to claim 32, wherein the ESD protection component is a diode element.

41. A light-emitting device according to claim 32, wherein:
- the first plate is a printed circuit board;
- a second plate is further disposed in a light-emitting direction of the light-emitting elements;
- the second plate is provided with a plurality of openings, each having a diameter of 1 mm or less, so as to respectively correspond to the plurality of light-emitting elements, the plurality of openings functioning as the plurality of light-passing structures; and
- the respective light-emitting elements which are electrically connected to the ESD protection component is in contact with the second plate.

42. A light-emitting device according to claim 1, wherein at least one of the light-emitting elements is a GaN-type compound semiconductor light-emitting element.

43. A recording device comprising a light-emitting device which includes a light-emitting element, the recording device performing a writing operation onto a recording paper using light emitted from the light-emitting element, wherein the light-emitting device is the one according to claim 1.

44. A recording device according to claim 43, which is configured such that a distance from a light-emitting surface of the light-emitting element to the recording paper is set to be 5 mm or less.

45. A light-emitting device, comprising:
- a first plate provided with a conductor pattern thereon;
- a plurality of light-emitting elements disposed at predetermined portions on the first plate, respectively; and
- a plurality of light-passing structures provided so as to respectively correspond to the plurality of light-emitting elements,
- wherein a second plate is further disposed in a direction perpendicular to the direction of light from the light-emitting elements; and
- wherein the second plate is provided with a plurality of openings, each having a diameter of 1 mm or less, so as to respectively correspond to the plurality of light-emitting elements, the plurality of openings functioning as the plurality of light-passing structures.

* * * * *